(12) United States Patent
Tanabe et al.

(10) Patent No.: US 7,772,759 B2
(45) Date of Patent: Aug. 10, 2010

(54) ELECTROOPTICAL APPARATUS AND METHOD OF MANUFACTURING ELECTROOPTICAL APPARATUS

(75) Inventors: Seiichi Tanabe, Shiojiri (JP); Yoshihiko Machida, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 538 days.

(21) Appl. No.: 11/378,313

(22) Filed: Mar. 20, 2006

(65) Prior Publication Data

US 2006/0220532 A1   Oct. 5, 2006

(30) Foreign Application Priority Data

Mar. 31, 2005 (JP) .............................. 2005-104976
Sep. 30, 2005 (JP) .............................. 2005-286395

(51) Int. Cl.
*H01J 1/62* (2006.01)

(52) U.S. Cl. .................... 313/500; 313/498; 445/24

(58) Field of Classification Search ......... 313/498–512; 315/169.1, 169.3; 428/690–691, 917; 438/26–29, 438/34, 82; 257/40, 72, 98–100, 642–643, 257/759; 427/58, 64, 66, 532–535, 539; 445/24–25

See application file for complete search history.

(56) References Cited

U.S. PATENT DOCUMENTS

| | | | |
|---|---|---|---|
| 5,853,310 A * | 12/1998 | Nishimura et al. | ............. 445/24 |
| 6,380,672 B1 | 4/2002 | Yudasaka | |
| 6,535,235 B1 * | 3/2003 | Nagumo | ..................... 347/237 |
| 6,642,651 B2 | 11/2003 | Yudasaka | |
| 6,784,459 B2 | 8/2004 | Seki et al. | |
| 6,885,148 B2 | 4/2005 | Yudasaka | |
| 6,924,593 B2 | 8/2005 | Seki et al. | |
| 7,025,647 B2 | 4/2006 | Miyazawa | |
| 7,045,955 B2 | 5/2006 | Seo et al. | |
| 7,186,581 B2 | 3/2007 | Seki et al. | |
| 7,288,420 B1 * | 10/2007 | Yamazaki et al. | ............. 438/29 |
| 7,364,939 B2 | 4/2008 | Yudasaka | |
| 7,378,291 B2 | 5/2008 | Yamazaki et al. | |
| 7,470,976 B2 | 12/2008 | Seki et al. | |
| 2002/0187575 A1 | 12/2002 | Maruyama et al. | |
| 2003/0164681 A1 | 9/2003 | Fukuoka et al. | |
| 2003/0184222 A1 * | 10/2003 | Nilsson et al. | ............... 313/512 |
| 2004/0140759 A1 * | 7/2004 | Park et al. | .................... 313/504 |
| 2004/0145546 A1 | 7/2004 | Hyuga | |
| 2005/0264187 A1 | 12/2005 | Seki et al. | |

(Continued)

FOREIGN PATENT DOCUMENTS

CN   1356857 A   7/2002

(Continued)

OTHER PUBLICATIONS

Feb. 22, 2010 European Search Report issued in Application No. 06006722.0.

(Continued)

*Primary Examiner*—Peter J Macchiarolo
*Assistant Examiner*—Donald L Raleigh
(74) *Attorney, Agent, or Firm*—Oliff & Berridge, PLC

(57) ABSTRACT

An electrooptical apparatus includes a light emission element array in which a plurality of light emission elements are arranged, and a barrier rib which surrounds the light emission element array.

18 Claims, 12 Drawing Sheets

U.S. PATENT DOCUMENTS

| | | |
|---|---|---|
| 2006/0192484 A1 | 8/2006 | Seo et al. |
| 2006/0199035 A1* | 9/2006 | Choulis et al. ............... 428/690 |
| 2007/0018152 A1 | 1/2007 | Seki et al. |
| 2008/0026501 A1 | 1/2008 | Yamazaki et al. |
| 2008/0180421 A1 | 7/2008 | Yudasaka |
| 2008/0315760 A1 | 12/2008 | Seki et al. |
| 2009/0009075 A1 | 1/2009 | Seki et al. |

FOREIGN PATENT DOCUMENTS

| | | |
|---|---|---|
| EP | 1 275 513 A1 | 1/2003 |
| JP | A-8-120228 | 5/1996 |
| JP | A-2000-30858 | 1/2000 |
| JP | A-2001-351787 | 12/2001 |
| JP | A 2002-222695 | 8/2002 |
| JP | A-2002-226792 | 8/2002 |
| JP | A-2003-022892 | 1/2003 |
| JP | A-2003-045665 | 2/2003 |
| JP | A-2003-133070 | 5/2003 |
| JP | A-2003-291406 | 10/2003 |
| JP | A-2004-095545 | 3/2004 |
| JP | 2004-267874 A | 9/2004 |
| JP | A-2004-356108 | 12/2004 |
| KR | 10-0583291 | 9/2004 |

OTHER PUBLICATIONS

May 20, 2010 Search Report issued in European Patent Application No. 06006722.0.

* cited by examiner

ELECTROOPTICAL APPARATUS AND METHOD OF MANUFACTURING ELECTROOPTICAL APPARATUS

BACKGROUND

1. Technical Field

The present invention relates to an electrooptical apparatus and a method of manufacturing the electrooptical apparatus.

2. Related Art

Recently, as a light emission element, an electrooptical apparatus called an optical writing head of a display or a printer using an organic electroluminescence element (hereinafter, referred to as "organic EL element") has been actively developed.

A method of manufacturing an electrooptical apparatus varies depending on whether a light emission material composing the organic EL element (hereinafter, referred to as "organic EL material") is a polymer organic material or a low molecular organic material. In addition, if the organic EL material is the polymer organic material, a liquid droplet discharge method of dissolving or dispersing the organic EL material in a specific solvent to form a liquid composition, discharging the liquid composition from a nozzle of a liquid droplet discharge head to coat the liquid composition on a specific pixel electrode is known. In this case, by providing a barrier rib in the periphery of the pixel electrode, the coated organic material liquid is prevented from being mixed with the liquid composition coated on a pixel electrode disposed at a different position and thus high-definition patterning can be performed.

However, in the liquid droplet discharge method, the solvent in the liquid composition coated on the pixel electrode is rapidly evaporated. Furthermore, the liquid composition coated on the edges (the upper edge, the lower edge, the right edge, and the left edge) of a substrate is more rapidly dried than the liquid composition coated on the center of the substrate, because the partial pressure of the solvent molecules of the liquid composition coated on the edges of the substrate is lower than that of the liquid composition coated on the center of the substrate. Accordingly, in the dry time, there is a difference between the liquid composition coated on the edges of the substrate and the liquid composition coated on the center of the substrate. The dry time difference between the liquid compositions causes unevenness in film thicknesses of layers of the organic EL element in a pixel or between pixels, and thus causes display unevenness such as brightness unevenness. Accordingly, a method of providing a dummy coating region which is not related to the display in the peripheries of the edges of the substrate to widen the coating region and making the vapor pressure of the solvent in the substrate uniform was suggested (See JP-A-2002-222695).

Furthermore, in order to increase light emission efficiency of the organic EL element, an electrooptical apparatus or an optical writing head having a hole injection layer or an electron injection layer provided between a light emission layer or an electrode is known.

However, the dry state of the liquid composition is also affected by the surface state of the barrier rib. Accordingly, although the dummy coating region is provided, if the surface state of the barrier rib is not uniform, it is difficult to form a uniform layer.

SUMMARY

An advantage of some aspects of the invention is that it provides an electrooptical apparatus and a method of manufacturing the electrooptical apparatus, which prevents unevenness of the film thicknesses of layers composing an organic light emission element and suppresses brightness unevenness or reliability deterioration due to the unevenness of the film thickness. Another advantage of some aspects of the invention is that it provides an electrooptical apparatus and a method of manufacturing the electrooptical apparatus, which arranges light emission elements with high density while suppressing brightness unevenness and forms a high-definition image.

According to an aspect of the invention, there is provided an electrooptical apparatus including: a light emission element array in which a plurality of light emission elements are arranged; and a barrier rib which surrounds the light emission element array.

By this structure, each of the light emission elements is not surrounded by the barrier rib. Accordingly, when the layer composing the light emission element is formed, for example, using a liquid droplet discharge method, the time of drying a discharged liquid composition does not vary depending on the surface state of the barrier rib. As the result, since the film thickness of all the light emission elements are uniformed, it is possible to provide an electrooptical apparatus which does not generate display unevenness such as brightness unevenness.

In the electrooptical apparatus, it is preferable that the barrier rib is formed such that the shape of the barrier rib corresponds to the shapes of the light emission elements. Here, corresponding the shape of the barrier rib to the shapes of the light emission elements represents that the distances from the outer peripheral surface of the light emission elements which are close to the barrier rib to the barrier rib are substantially uniform.

By this structure, since the distances from the light emission elements to the barrier rib, that is, the amounts of the liquid composition surrounding the light emission elements are unformed, the dry conditions of the layers of the light emission elements are uniform at different positions. As the result, the film thickness in the light emission element or between the light emission elements is uniform.

In the electrooptical apparatus, it is preferable that the plurality of light emission elements are formed by a liquid process.

By this structure, when forming the light emission element, the liquid including a material composing the light emission element (for example, a light emission material composing a light emission layer of the light emission element) is coated in the region surrounded by the barrier rib. At this time, since the barrier rib is not provided in the region, the liquid coated in the region is not influenced by the surface state of the barrier rib. As the result, since the uniform amount of the liquid is coated over the whole region regardless of the position of the region, the film thickness of a layer composing the light emission element (for example, a light emission layer) is uniform. Accordingly, since the unevenness of the film thicknesses of the layers in the pixel or between the pixels is not generated, it is possible to suppress the display unevenness such as brightness unevenness.

In the electrooptical apparatus, it is preferable that the plurality of light emission elements are formed by forming a function layer including at least a light emission layer between a plurality of pixel electrodes and a common electrode facing the plurality of pixel electrodes, and the light emission layer is composed of an organic material.

By this structure, it is possible to construct an organic electroluminescence element including a light emission layer having a uniform film thickness. Accordingly, it is possible to easily realize an electrooptical apparatus which does not generate display unevenness such as brightness unevenness.

In the electrooptical apparatus, it is preferable that the light emission elements are arranged in a zigzag shape.

By this structure, it is possible to form the light emission element with high density. As the result, it is possible to an electrooptical apparatus which does not generate display unevenness such as brightness unevenness.

In the electrooptical apparatus, it is preferable that an electrical resistance value of the function layer disposed between the plurality of pixel electrodes is higher than that of the function layer disposed in a region sandwiched between the pixel electrodes and the common electrode.

By this structure, since the electrical resistance value of the function layer disposed in the vicinities of the plurality of pixel electrodes is higher than that of the function layer disposed in a region sandwiched between the pixel electrodes and the common electrode, carriers supplied from the pixel electrodes mostly flow into the function layer facing any one pixel electrode, but hardly flow into the function facing the other pixel electrode. Accordingly, the crosstalk of the light emission that-the carriers supplied to any pixel electrode flow into the vicinity of the pixel electrode to emit light is not generated. As the result, it is possible to realize an electrooptical apparatus including a light emission unit which can perform high-definition display.

In the electrooptical apparatus, it is preferable that the function layer includes an organic conductive layer, and an electrical resistance value of the organic conductive layer disposed between the plurality of pixel electrodes is higher than that of the organic conductive layer disposed in a region sandwiched between the plurality of pixel electrodes and the common electrode.

By this structure, since the organic conductive layer is provided, although the organic conductive layer is made of a material having high conductivity (low electrical resistance material), the carriers mostly flow into the organic conductive layer formed in the region facing the pixel electrodes, but hardly flow into the organic conductive layer formed in the vicinities of the pixel electrodes. As the result, it is possible to realize the electrooptical apparatus which can perform high-definition display.

In the electrooptical apparatus, it is preferable that the organic conductive layer includes Poly-3,4-Ethylenedioxythiophene.

By the organic conductive layer including Poly-3,4-Ethylenedioxythiophene, it is possible to obtain high conductivity and high efficiency of injecting holes into the light emission layer. Accordingly, it is possible to realize a light emission unit having high light emission efficiency with a low driving voltage. As the result, it is possible to realize an electrooptical apparatus including the light emission unit which can form an image with high efficiency and high definition.

In the electrooptical apparatus, it is preferable that the organic conductive layer includes Polyaniline.

By this structure, the organic conductive layer including Polyaniline is a material having high conductivity (low electrical resistance material) and functions as a hole injection layer. Accordingly, by providing the organic conductive layer including Polyaniline, it is possible to realize a light emission unit having high light emission efficiency. As the result, it is possible to realize an electrooptical apparatus including the light emission unit which can perform display with high efficiency and high definition.

In the electrooptical apparatus, it is preferable that the light emission element array selectively irradiates light onto a photosensitive body.

By this structure, it is possible to perform optical writing on a photosensitive body with low brightness unevenness, high resolution, and high intensity.

According to another aspect of the invention, there is provided a method of manufacturing an electrooptical apparatus including: forming a plurality of pixel electrodes; forming a barrier rib which surrounds the whole of the plurality of pixel electrodes; and forming a function layer in a region surrounded by the barrier rib.

By this structure, each of the light emission elements is not surrounded by the barrier rib. Accordingly, when the layer composing the light emission element is formed, for example, using a liquid droplet discharge method, the time of drying a discharged liquid composition does not vary depending on the position of the pixel or the surface state of the barrier rib. As the result, since the film thickness of all the light emission elements are uniformed, it is possible to provide an electrooptical apparatus which does not generate display unevenness such as brightness unevenness.

In the method of manufacturing the electrooptical apparatus, it is preferable that the function is formed using a liquid droplet discharge method.

By this structure, it is possible to form a layer having a desired film thickness without using a vacuum apparatus.

In the method of manufacturing the electrooptical apparatus, it is preferable that a step of selectively irradiating light onto the function layer is further included.

By this structure, it is possible to prevent the crosstalk of the light emission that the carriers supplied to any pixel electrode flow into the vicinity of the pixel electrode to emit light.

In the method of manufacturing the electrooptical apparatus, it is preferable that light is selectively irradiated onto the function layer in a region disposed between the pixel electrodes.

By this structure, it is possible to prevent the crosstalk of the light emission that the carriers supplied to any pixel electrode flow into the adjacent function layer and thus the function layer adjacent to the pixel electrode emits light.

In the method of manufacturing the electrooptical apparatus, it is preferable that the light is ultraviolet light.

By this structure, it is possible to easily increase the electrical resistance value of the function layer formed in the vicinities of the plurality of pixel electrodes.

In the method of manufacturing the electrooptical apparatus, it is preferable that the function layer is heated after irradiating the light.

By this structure, it is possible to increase the electrical resistance of a region onto which light is irradiated by irradiating the function layer and performing a heating treatment with high reproducibility.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, as an electrooptical apparatus including an optical writing head according to a first embodiment of the invention, an optical printer will be described with reference to the attached drawings. In addition, the optical printer is a tandem type optical printer which can perform full-color display.

Figure 1:
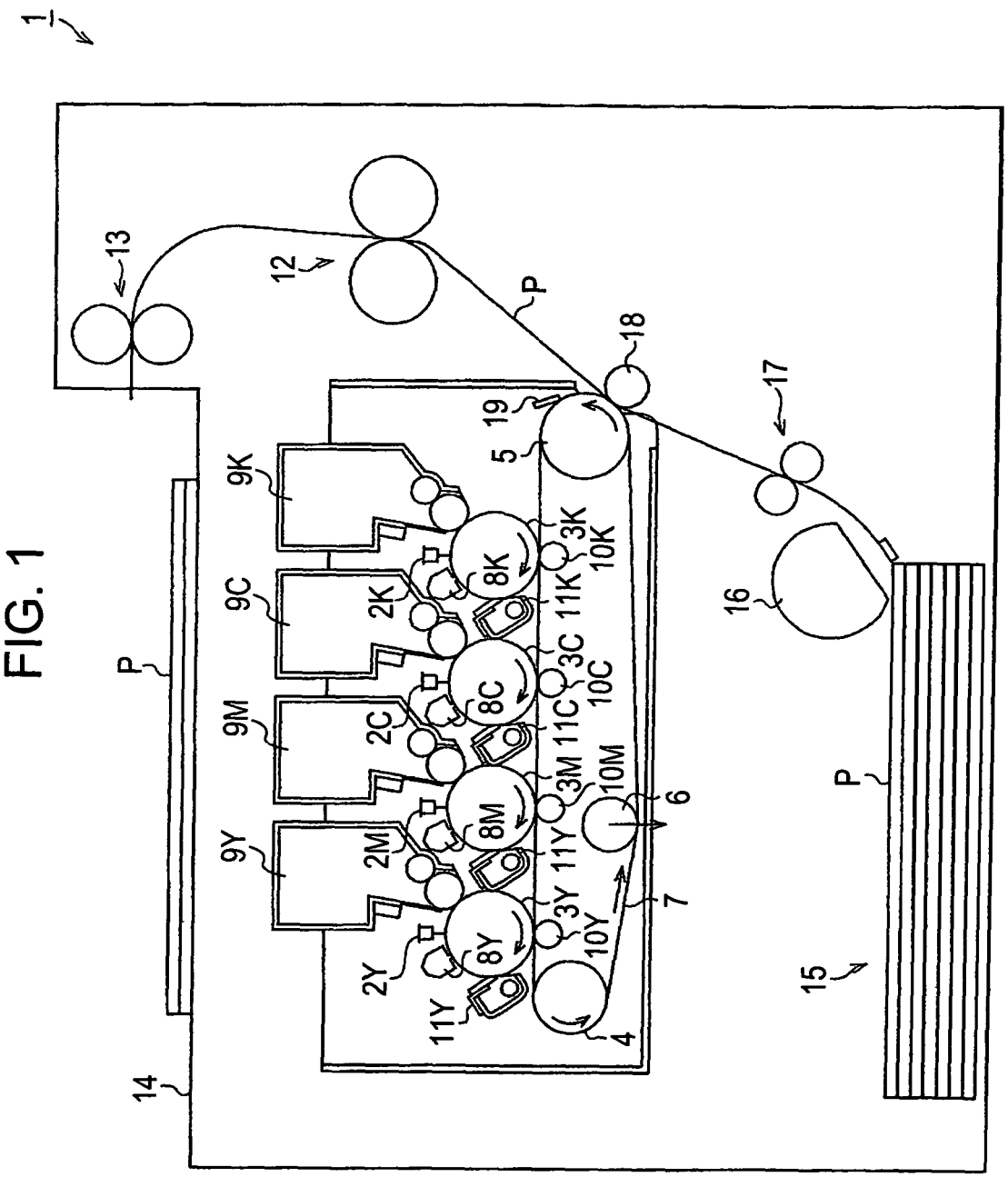
FIG. 1 is a cross-sectional view of main portions of an optical printer.

FIG. 1 is a cross-sectional view of main portions of an optical printer.

As shown in FIG. 1, the optical printer 1 includes a black organic EL exposure head 2K, a cyan organic EL exposure head 2C, a magenta organic EL exposure head 2M, and a yellow organic EL exposure head 2Y, as an optical writing head and a light emission unit. In addition, the optical printer 1 includes a black photosensitive drum 3K, a cyan photosensitive drum 3C, a magenta photosensitive drum 3M, and a yellow photosensitive drum 3Y below the exposure head 2K, 2C, 2M, and 2Y, respectively.

Furthermore, the optical printer 1 includes a driving roller 4, a driven roller 5, a tension roller 6, and an intermediate transfer belt 7 which is tightly supported by tension supplied from the tension roller 6 and rotates in a counterclockwise direction of FIG. 1. In addition, the photosensitive drums 3K, 3C, 3M, and 3Y are arranged at a predetermined interval with respect to the intermediate transfer belt 7.

The photosensitive drums 3K, 3C, 3M, and 3Y rotate in a clockwise direction of FIG. 1 in synchronization with the driving of the intermediate transfer belt 7. The exposure heads 2K, 2C, 2M, and 2Y sequentially line-scan the outer circumferential surfaces of the photosensitive drums 3K, 3C, 3M, and 3Y in synchronization with the rotation of the photosensitive drums 3K, 3C, 3M, and 3Y to form electrostatic latent images according to image data on the respective photosensitive drums 3K, 3C, 3M, and 3Y.

Furthermore, in the vicinities of the photosensitive drums 3K, 3C, 3M, and 3Y, corona chargers 8K, 8C, 8M, and 8Y for uniformly charging the outer circumferential surfaces of the photosensitive drums 3K, 3C, 3M, and 3Y are provided.

Moreover, the optical printer 1 includes a black developing device 9K, a cyan developing device 9C, a magenta developing device 9M, and a yellow developing device 9Y in the vicinities of the black photosensitive drum 3K, the cyan photosensitive drum 3C, the magenta photosensitive drum 3M, and the yellow photosensitive drum 3Y, respectively. The respective developing devices 9K, 9C, 9M, and 9Y applies toners which are developing agents to the respective electrostatic latent images formed on the photosensitive drums 3K, 3C, 3M, and.3Y by the respective organic EL exposure heads 2K, 2C, 2M, 2Y to form visible images (toner images). For example, the cyan developing device 9C applies a cyan toner to the electrostatic latent image formed on the cyan photosensitive drum 3C by the cyan organic EL exposure head 2C to form a visible image (toner image).

In more detail, the developing devices 9K, 9C, 9M, and 9Y use, for example, nonmagnetic one-component toners. The one-component developing agents are carried to developing rollers by feeding rollers and the film thicknesses of the toners attached to the surfaces of the developing rollers are controlled by control blades. The developing rollers contact or press the photosensitive drums 3K, 3C, 3M, and 3Y such that the developing agents are attached to the electrostatic latent images formed on the photosensitive drums 3K, 3C, 3M, and 3Y in accordance with their potential levels, thereby forming the visible images (toner images).

Furthermore, the optical printer 1 includes primary transfer rollers 10K, 10C, 10M, and 10Y, which sequentially transfer the visible images (toner images) formed by the developing devices 9K, 9C, 9M, and 9Y onto the intermediate transfer belt 7 which is a primary transfer target, in the vicinities of the photosensitive drums 3K, 3C, 3M, and 3Y, respectively. In addition, the optical printer 1 includes cleaning devices 11K, 11C, 11M, and 11Y in the vicinities of the photosensitive drums 3K, 3C, 3M, and 3Y, respectively. The cleaning devices 11K, 11C, 11M, and 11Y remove the toners remaining on the surfaces of the photosensitive drums 3K, 3C, 3M, and 3Y after the primary transfer.

The respective black, cyan, magenta, and yellow visible images (toner images) formed on the photosensitive drums 3K, 3C, 3M, and 3Y are sequentially transferred onto the intermediate transfer belt 7 by the primary transfer rollers 10K, 10C, 10M, and 10Y. A full-color visible image (toner image) formed by sequentially overlapping the respective color visible images on the intermediate transfer belt 7 by the primary transfer is secondarily transferred onto a recording medium P such as a sheet of paper by a secondary transfer roller, and the recording medium P passes through a pair of fixing rollers 12 such that the full-color visible image is fused on the recording medium P. The recording medium P on which the visible image (toner image) is formed is guided by a sheet discharging roller 13 to be discharged on a sheet discharging tray 14 provided at the upper side of the optical printer 1.

Moreover, the optical printer 1 includes a sheet feeding cassette 15 for containing a plurality of recording mediums P, a pickup roller 16 for feeding the recording medium P from the sheet feeding cassette 15 one sheet by one sheet, and a gate roller 17 for controlling a timing of feeding the recording medium P to a secondary transfer unit of the secondary transfer roller 18. In addition, the optical printer 1 includes a second transfer roller 18 composing the secondary transfer unit with the intermediate transfer belt 7 and a cleaning blade 19 for removing the toner remaining on the surface of the intermediate transfer belt 7 after the secondary transfer.

Next, the organic EL exposure heads 2K, 2C, 2M, and 2Y will be described in detail. In addition, since all the black organic EL exposure head 2K, the cyan organic EL exposure head 2C, the magenta organic EL exposure head 2M, and the yellow organic EL exposure head 2Y have the same structure, for convenience's sake of explanation, the black organic EL exposure head 2K will be described and the detailed description of the other organic EL exposure heads 2C, 2M, and 2Y will be omitted.

Figure 2:
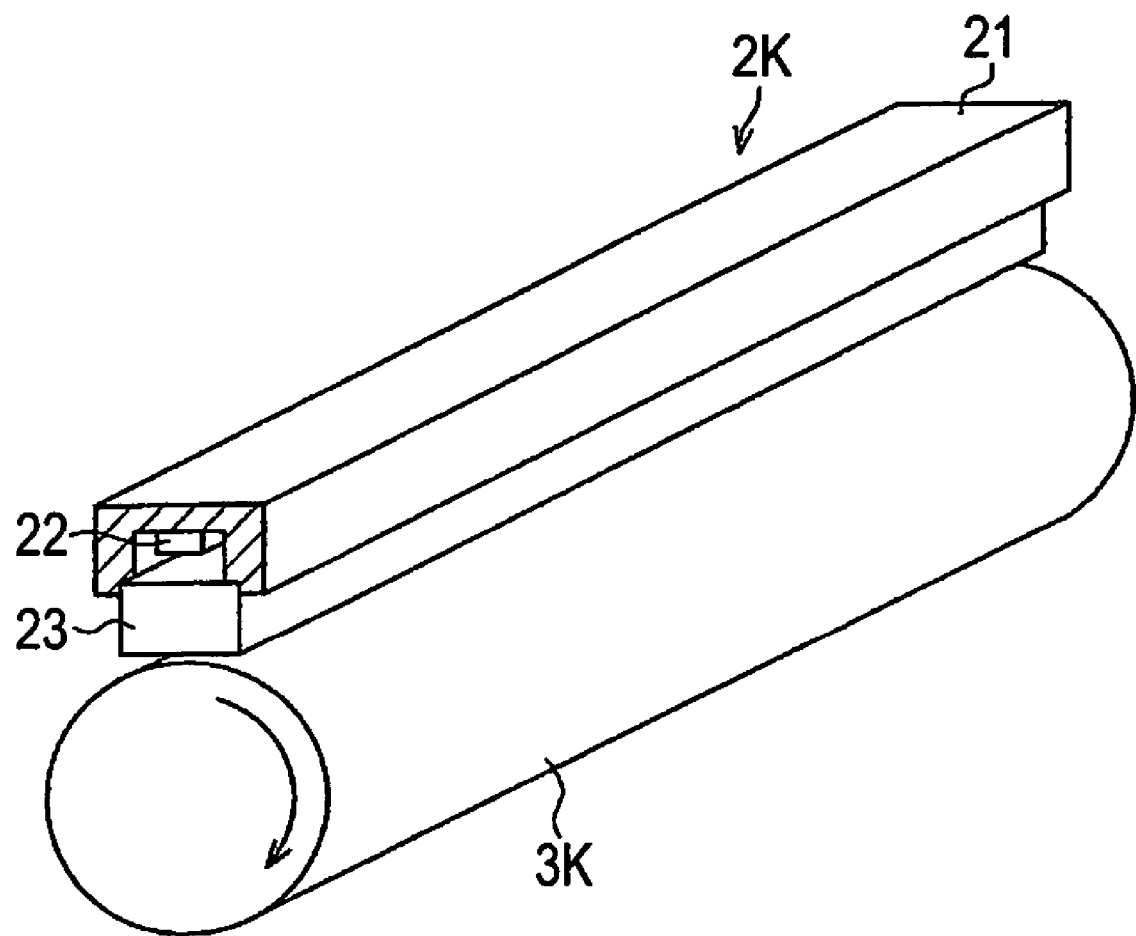
FIG. 2 is a perspective view of a black organic EL exposure head.

FIG. 2 is a perspective view of the black organic EL exposure head 2K. The black organic EL exposure head 2K includes a box body 21 placed in a direction perpendicular to a direction of carrying the intermediate transfer belt 7 and an optical member 23 supported and fixed to the box body 21 and placed between the box body 21 and the black photosensitive drum 3K. The box body 21 has an opening at the side of the black photosensitive drum 3K. A light emission element array 22 is fixed to the box body 21 such that light is emitted toward the opening.

Figure 3A:
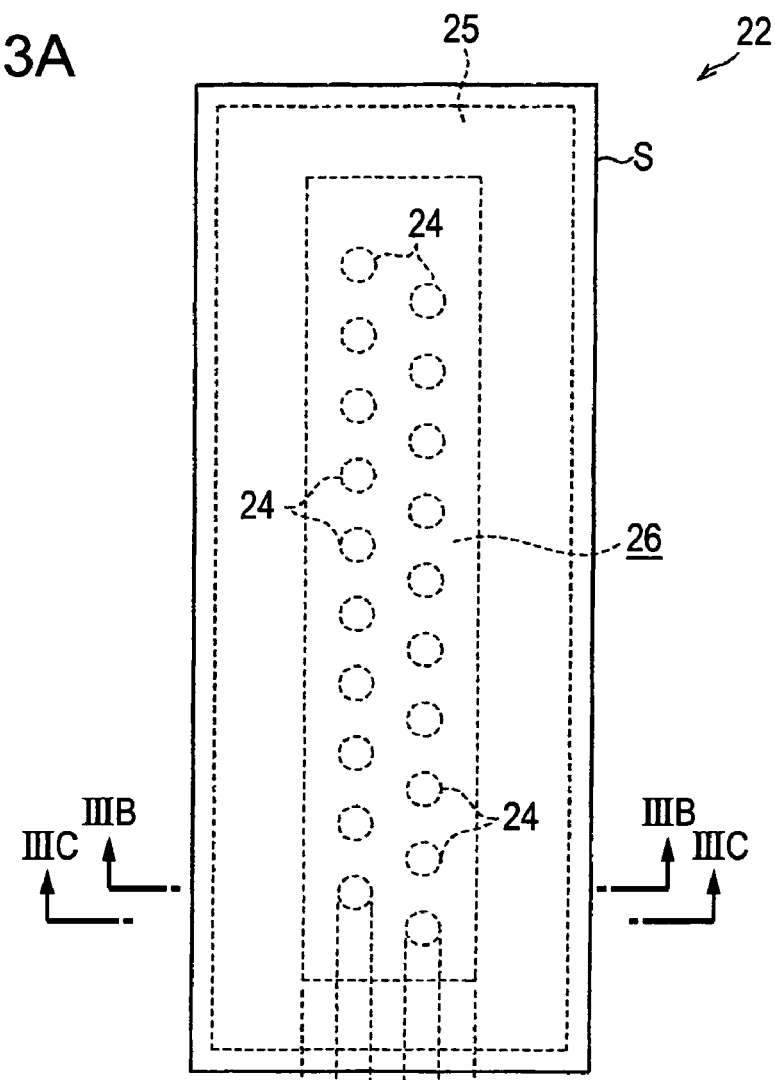
FIG. 3A is a front view of a light emission element array according to a first embodiment.
Figure 3B:
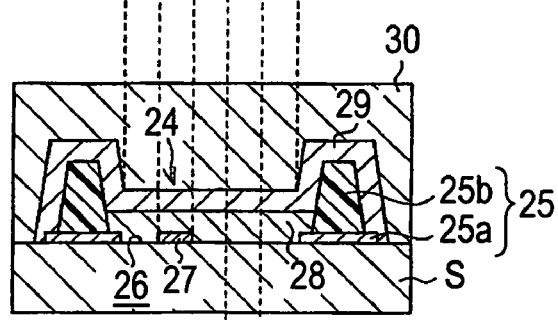
FIG. 3B is a cross-sectional view taken along line IIIB-IIIB of FIG. 3A.
Figure 3C:
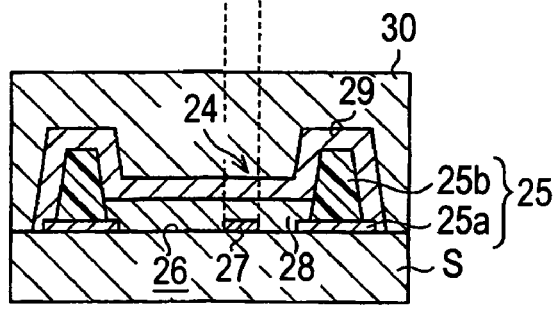
FIG. 3C is a cross-sectional view taken along line IIIC-IIIC of FIG. 3A.

FIG. 3A is a front view of the light emission element array, FIG. 3B is a cross-sectional view taken along line IIIB-IIIB of FIG. 3A, and FIG. 3C is a cross-sectional view taken along line IIIC-IIIC of FIG. 3A.

As shown in FIG. 3A, the light emission element array 22 includes a plurality of organic electroluminescence elements 24 (hereinafter, referred to as "organic EL element") arranged on a substrate S as a light emission element. In the light emission element array 22 according to the present embodiment, the plurality (in the present embodiment, ten) of organic EL elements 24, which are vertically arranged in a row with the same pitch, are horizontally arranged in two columns. In addition, one column of organic EL elements 24 is vertically deviated from the other column of organic EL elements 24 by a half-pitch. That is, the organic EL elements 24 are arranged in a zigzag shape.

Moreover, in the peripheries of the plurality of organic EL elements 24, a bank 25 is formed to surround the whole of the plurality of organic EL elements 24 as a barrier rib. The bank 25 of the present embodiment, as shown in FIG. 3A, has substantially a rectangular shape to surround the whole of the plurality of organic EL elements 24.

As shown in FIGS. 3B and 3C, the bank 25 includes a lyophilic bank 25a formed on the substrate S and a lyophobic bank 25b formed on the lyophilic bank 25a. A portion of the lyophilic bank 25a is protruded from the lyophobic bank 25b toward the center of the substrate S. The lyophilic bank 25a is made of a lyophilic material, for example, silicon oxide ($SiO_2$). Alternatively, the lyophilic bank 25a may be made of a material which does not have lyophilicity and of which the surface is subjected to a known lyophilic treatment. Meanwhile, the lyophobic bank 25b may be made of a lyophobic material, for example, fluoric resin. Alternatively, the lyophobic bank 25b may be made of a material formed by patterning organic resin which does not have lyophobicity, such as acrylic resin or polyimide resin, and performing a lyophobic treatment to the surface of the organic resin by a $CF_4$ plasma treatment.

Moreover, as shown in FIGS. 3B and 3C, a concave region 26 is formed at the center of the substrate S by the bank 25 as an element forming region. Pixel electrodes 27 are formed on the bottom of the concave region 26 as an anode. Each of the pixel electrodes 27 of the present embodiment is circular. In addition, the plurality (in the present embodiment, ten) of pixel electrodes 27 of the present embodiment, which are vertically formed in a row with the same pitch, are horizontally formed in two columns. One column of pixel electrodes 27 is deviated from the other column of pixel electrodes 27 by a half-pitch. The pixel electrodes 27 are connected to a data signal output driving circuit (not shown) through independent wirings. Furthermore, an image data signal output from the data signal output driving circuit is supplied to the pixel electrodes 27.

Moreover, a light emission layer 28 is formed on the bottom of the concave region 26 to cover the whole surface of the concave region 26. Accordingly, the light emission layer 28 is laminated on the pixel electrodes 27. A cathode 29 is formed over the whole surfaces of the lyophobic bank 25b and the light emission layer 28 as a common electrode. The cathode 29 is connected to the data signal output driving circuit. In addition, a sealing member 30 is formed on the whole surface of the cathode 29. The pixel electrodes 27, the cathode 29 facing the pixel electrodes 27, and the light emission layer 28 formed between the pixel electrode 27 and the cathode 29 compose the organic EL element 24.

In the organic EL exposure head 2K having the aforementioned structure, as shown in FIGS. 3B and 3C, the film thickness of the light emission layer 28 is uniform over the whole of the concave region 26. Accordingly, the light emission layer 28 having the uniform film thickness is formed on the pixel electrodes 27. In addition, the film thickness of the light emission layer 28 formed on a specific pixel electrode 27 and the film thickness of the light emission layer 28 formed on the other pixel electrode 27 are uniform.

Figure 4:
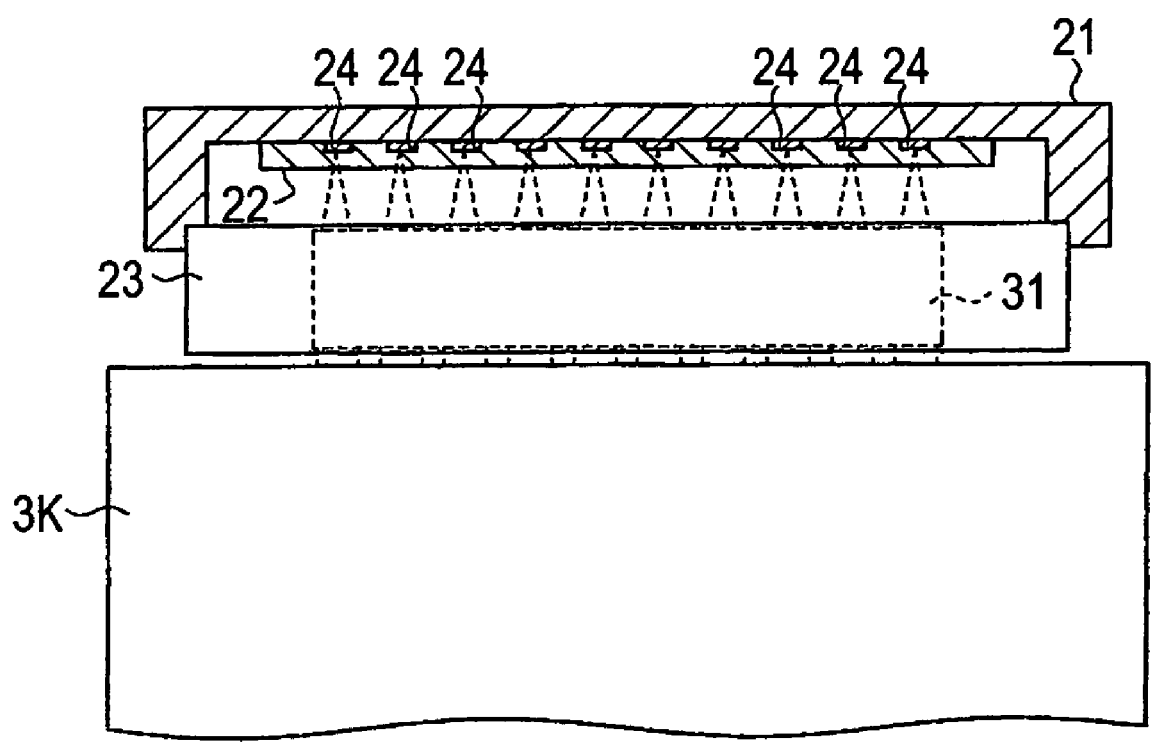
FIG. 4 illustrates a structure of an optical member.

As shown in FIG. 4, the optical member 23 faces the light emission element array 22. The optical member 23 includes a plurality of lenses 31 therein, concentrates light emitted from the organic EL element 24, and then emits the light at the other end thereof to irradiate the light onto the black photosensitive drum 3K.

Similarly, in the other organic EL exposure heads 2C, 2M, and 2Y, the film thicknesses of the light emission layers of the organic EL elements provided in the respective light emission element arrays are uniform. In addition, the other organic EL exposure heads 2C, 2M, and 2Y emit the light from the other end of the optical member 23 toward the respective photosensitive drums 3C, 3M, and 3Y. The potential levels of the photosensitive drums 3K, 3C, 3M, and 3Y varies depending on the emitted light to control attachment forces of the toners and thus the visible images (toner images) are formed on the photosensitive drums 3K, 3C, 3M, and 3Y in accordance with the image data signal. At this time, since the film thicknesses of the light emission layers of the respective organic EL elements 24 provided in the organic EL exposure heads 2K, 2C, 2M, and 2Y are uniform, the visible images (toner images) formed on the photosensitive drums 3K, 3C, 3M, and 3Y do not have display unevenness such as brightness unevenness.

Next, a method of manufacturing the organic EL exposure heads 2K, 2C, 2M, and 2Y will be described with reference to FIG. 5. The black organic EL exposure head 2K, the cyan organic EL exposure head 2C, the magenta organic EL exposure head 2M, and the yellow organic EL exposure head 2Y are manufactured by the same method. Accordingly, for convenience' sake of explanation, only the method of manufacturing the black organic EL exposure head 2K will be described and the detailed description of the other organic EL exposure heads 2C, 2M, and 2Y will be omitted.

Figure 5A:
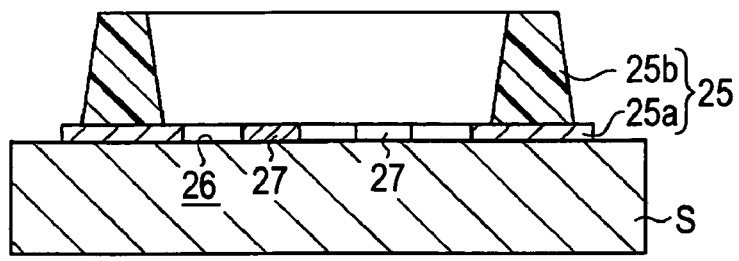
FIGS. 5A to 5D illustrate a method of manufacturing an organic EL exposure head.

First, the plurality of pixel electrodes 27 are formed on the substantial center of the substrate S in the zigzag shape using a known method. Subsequently, as shown in FIG. 5A, silicon oxide $SiO_2$ is formed and patterned on the substrate S in the peripheries of the plurality of pixel electrodes 27 to surround the whole of the plurality of pixel electrodes 27, thereby forming the lyophilic bank 25a. Thereafter, fluoric resin is formed and patterned at a height of 1 to 2 μm on the lyophilic bank 25a to form the lyophobic bank 25b such that a portion of the lyophilic bank 25a is protruded toward the center of the substrate S. Accordingly, the bank 25 is formed on the substrate S to surround the whole of the plurality of pixel electrodes 27 in the peripheries of the plurality of pixel electrodes 27 (a bank forming step). As the result, the concave region 26 is formed in the center of the substrate S on which the pixel electrodes 27 are formed.

Figure 5B:
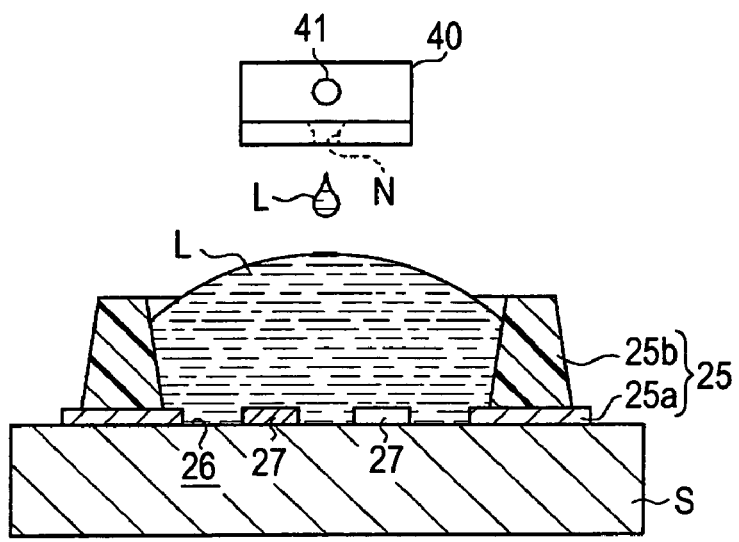

Subsequently, the light emission layer 28 is formed in the concave region 26 using a liquid droplet discharge method as a liquid process (an element forming process). That is, as shown in FIG. 5B, a liquid composition formed by dissolving or dispersing a light emission material, which is the composition of the light emission layer 28, in a specific solvent such as xylene is discharged from a nozzle N of a discharge head 40. At this time, while the discharge head 40 moves relative to the substrate S along a guide rail 41 which is provided in the discharge head 40 and extends along the front side and the rear side of the paper, the liquid composition L is sequentially discharged in the concave region 26 in plural times. Accordingly, the liquid composition L is coated on the whole surface of the concave region 26.

Figure 5C:
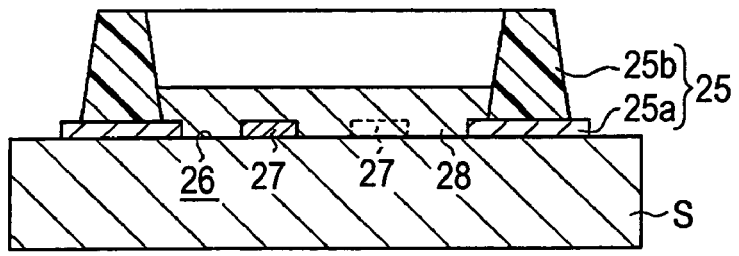
Figure 5D:
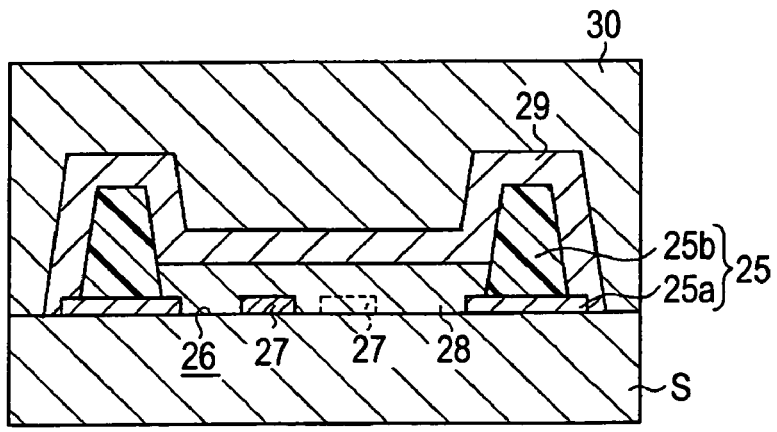

Next, by mounting the substrate S on, for example, a hot plate, the substrate S may be heated to evaporate the solvent in the liquid composition L, and thus the light emission layer 28 is formed on the whole surface of the concave region 26 (see FIG. 5C).

At this time, since the bank is not formed between the pixel electrodes 27, the time of drying the discharged liquid composition L do not vary depending on the surface state of the bank formed between the pixel electrodes 27. Accordingly, although the light emission layer 28 is formed over the whole surface of the concave region 26 after drying, the film thickness of the light emission layer 28 is uniform over the whole surface of the concave region 26.

Thereafter, a LiF layer, a Ca layer, and an Al layer are laminated on the bank 25 and the light emission layer 28 by a deposition method to form the cathode 29. Subsequently, the sealing member 30 made of a material having a light transmittance, for example, resin, is formed on the whole surface of the cathode 29 (see FIG. 5D).

As described above, the present embodiment has the following effect.

According to the present embodiment, the bank 25 surrounding the whole of the pixel electrodes 27 of the plurality of organic EL elements 24 is formed on the substrate S. In addition, the liquid composition L is coated on the whole surface of the concave region 26 which is formed at the center of the substrate S by the bank 25 to form the light emission layer 28.

Accordingly, since the bank do not exist in each of the pixel electrodes 27 (organic EL element 24), the time of drying the discharged liquid composition L does not vary depending on the surface states of the banks in the pixel electrodes 27. Accordingly, the film thickness of the light emission layer 28 is uniform over the whole surface of the concave region 26. As the result, the organic EL elements 24 formed in the bank 25 can form the visible image (toner image) without the display unevenness such as the brightness unevenness.

According to the present embodiment, each of the organic EL exposure heads 2K, 2C, 2M, and 2Y includes the light emission element array 22 having the plurality of organic EL elements 24 and the optical member 23 facing the light emission element array 22. In addition, the light emitted from the respective organic EL elements 24 is concentrated by the optical member 23 and irradiated onto the photosensitive drums 3K, 3C, 3M, and 3Y. At this time, since the light emission layers 28 of the respective organic EL elements 24 have the uniform film thicknesses, the toner images formed on the photosensitive drums 3K, 3C, 3M, and 3Y do not have the display unevenness such as the brightness unevenness. As the result, it is possible to provide the optical printer 1 which can print an image having excellent display quality.

According to the present embodiment, the light emission layer 28 is formed in the concave region 26 using the liquid droplet discharge method. Accordingly, the light emission layer 28 having a desired film thickness can be formed without using a vacuum device and so on. In addition, in the liquid droplet discharge method, since the light emission layer 28 is formed by discharging the liquid composition L formed by dissolving or dispersing the light emission material, which is the composition of the light emission layer 28, in the solvent (for example, xylene) into the concave region 26, and drying the discharged liquid composition L, it is possible to perform high-definition patterning, regardless of the shape of the concave region 26.

Second Embodiment

Next, a second embodiment of the invention will be described with reference to FIG. 6. In the second embodiment, the same elements as those of the first embodiment are denoted by the same reference numerals and their detailed description will be omitted.

Figure 6A:
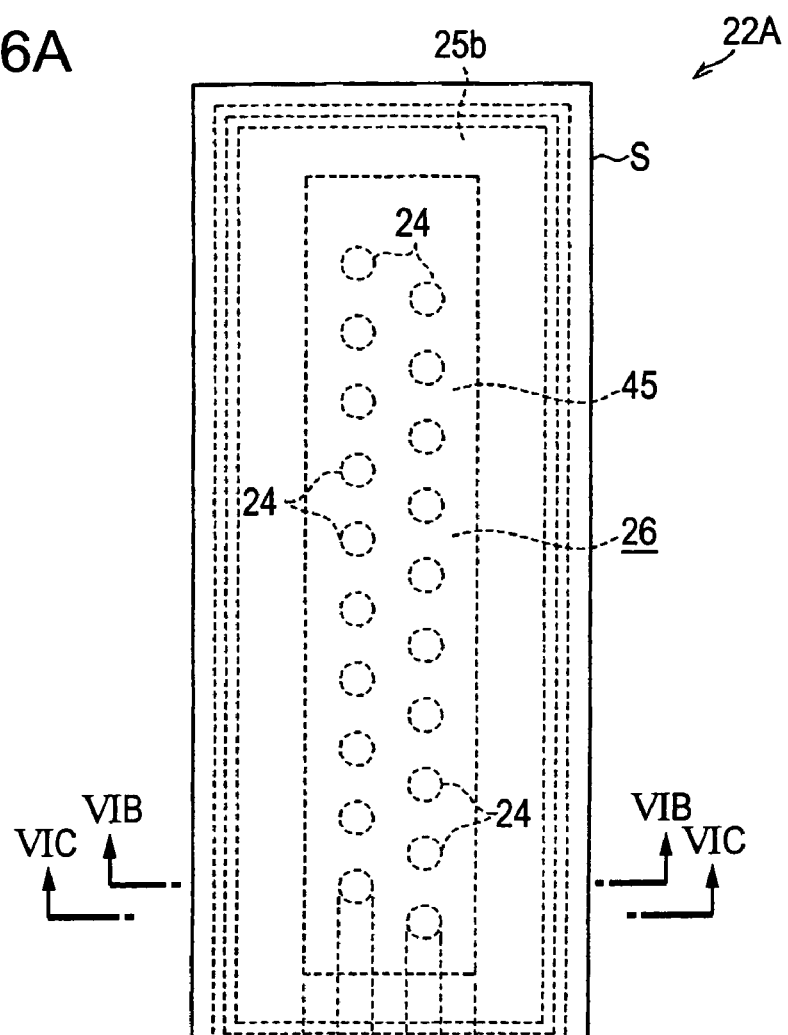
FIG. 6A is a front view of a light emission element array according to a second embodiment.
Figure 6B:
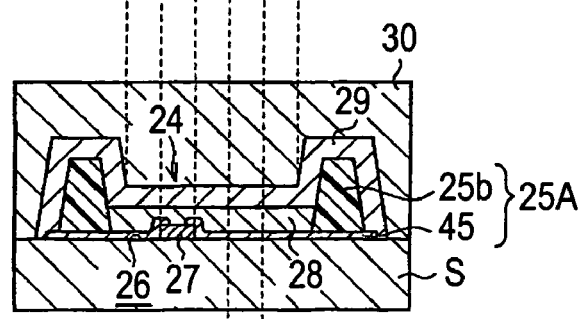
FIG. 6B is a cross-sectional view taken along line VIB-VIB of FIG. 6A.
Figure 6C:
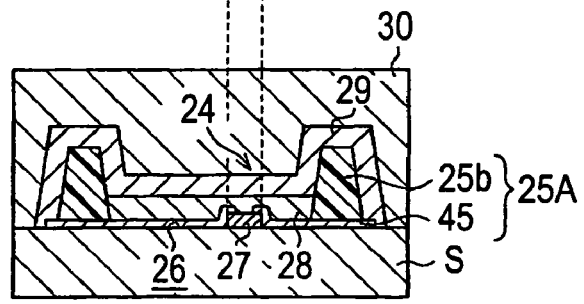
FIG. 6C is a cross-sectional view taken along line VIC-VIC of FIG. 6A.

FIG. 6A is a front view of a light emission element array 22A according to a second embodiment, FIG. 6B is a cross-sectional view taken along line VIB-VIB of FIG. 6A, and FIG. 6C is a cross-sectional view taken along line VIC-VIC of FIG. 6A.

As shown in FIG. 6A, similar to the first embodiment, the light emission element array 22A includes a plurality of organic EL elements 24 arranged on a substrate S and a lyophobic bank 25b surrounds the whole of the light emission element array 22A. Meanwhile, in the present embodiment, a lyophilic bank 45 is disposed to define the pixel electrodes 27.

For example, the lyophilic bank 45 is formed of silicon oxide $SiO_2$ at a film thickness of 50 to 150 nm. Alternatively, the lyophilic bank 45 may be made of a material which does not have lyophilicity and of which the surface is subjected to a lyophilic treatment.

Accordingly, it is possible to avoid concentrating the electric field to the ends of the pixel electrodes 27. As the result, it is possible to increase the life span of the organic EL element 24.

Third Embodiment

Next, a third embodiment of the invention will be described with reference to FIG. 7. In the third embodiment, the same elements as those of the first and second embodiments are denoted by the same reference numerals and their detailed description will be omitted.

Figure 7:
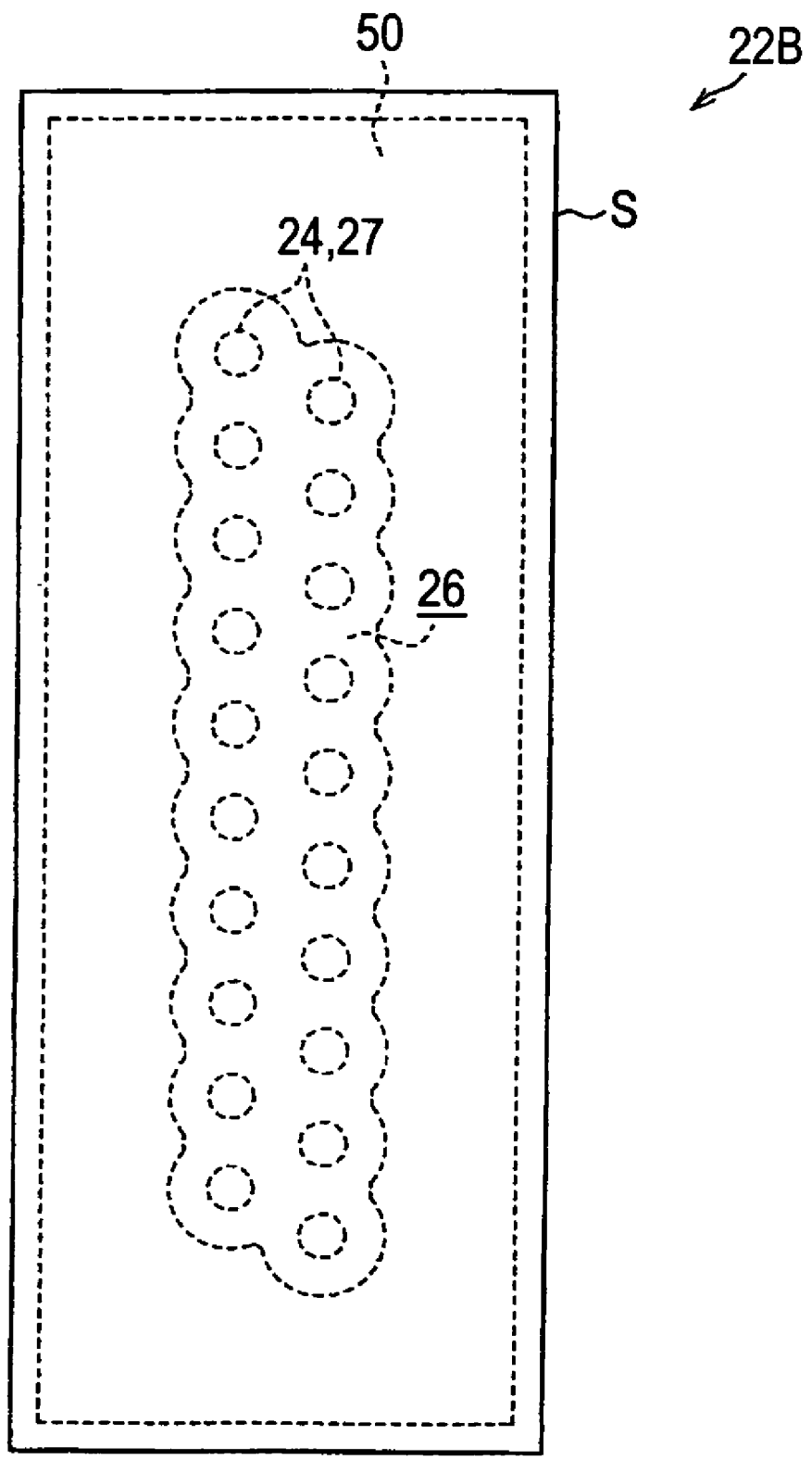
FIG. 7 is a front view of a light emission element array according to a third embodiment.

FIG. 7 is a front view of a light emission element array 22B according to a third embodiment. As shown in FIG. 7, in the light emission element array 22B, one bank 50 is formed to surround the whole of a plurality of organic EL elements 24, similar to the first embodiment. In the light emission element array 22B, the shape of the bank 50 formed on a substrate S is different from that of the bank 25 of the first embodiment. That is, as shown in FIG. 7, in the present embodiment, the bank 50 is formed such that the inner shape of the concave region 26 at side of the center of the substrate corresponds to the shape of the pixel electrode 27 of the organic EL element 24. In the present embodiment, since the pixel electrode 27 is circular, the shape of the concave region 26 of the bank 50 is also circular to correspond to the shapes of the pixel electrodes 27. Accordingly, the distances from the centers of the pixel electrodes 27 to the bank 50 become equal. Then, the liquid composition L is coated in the concave region 26 by the liquid droplet discharge method and the substrate S is then dried using, for example, a hot plate. At this time, since the partial pressure of the solvent molecules of the liquid composition L coated on the edges (the upper edge, the lower edge, the right edge, and the left edge) of the substrate S is less than that of the liquid composition L coated on the center of the substrate S, the liquid composition L coated on the edges of the substrate S first starts to be dried. At this time, since the distances from the centers of the pixel electrodes 27 to the bank 50 are equal, dry unevenness on the pixel electrodes 27 can be reduced.

As described above, according to the present embodiment, the following effect can be obtained.

According to the present embodiment, the shape of the concave region 26 of the bank 50 corresponds to the shape of the pixel electrode 27 of the organic EL element 24. Accordingly, the distances from the centers of the pixel electrodes 27 to the bank 50 are equal. As the result, since the dry unevenness on the pixel electrodes 27 can be reduced, it is possible to form the organic EL elements 24 including the light emission layer 28 having a more uniform film thickness.

Fourth Embodiment

Next, a fourth embodiment of the invention will be described with reference to FIGS. 8 to 11. In the fourth embodiment, the same elements as those of the first embodiment are denoted by the same reference numerals and their detailed description will be omitted.

Figure 8A:
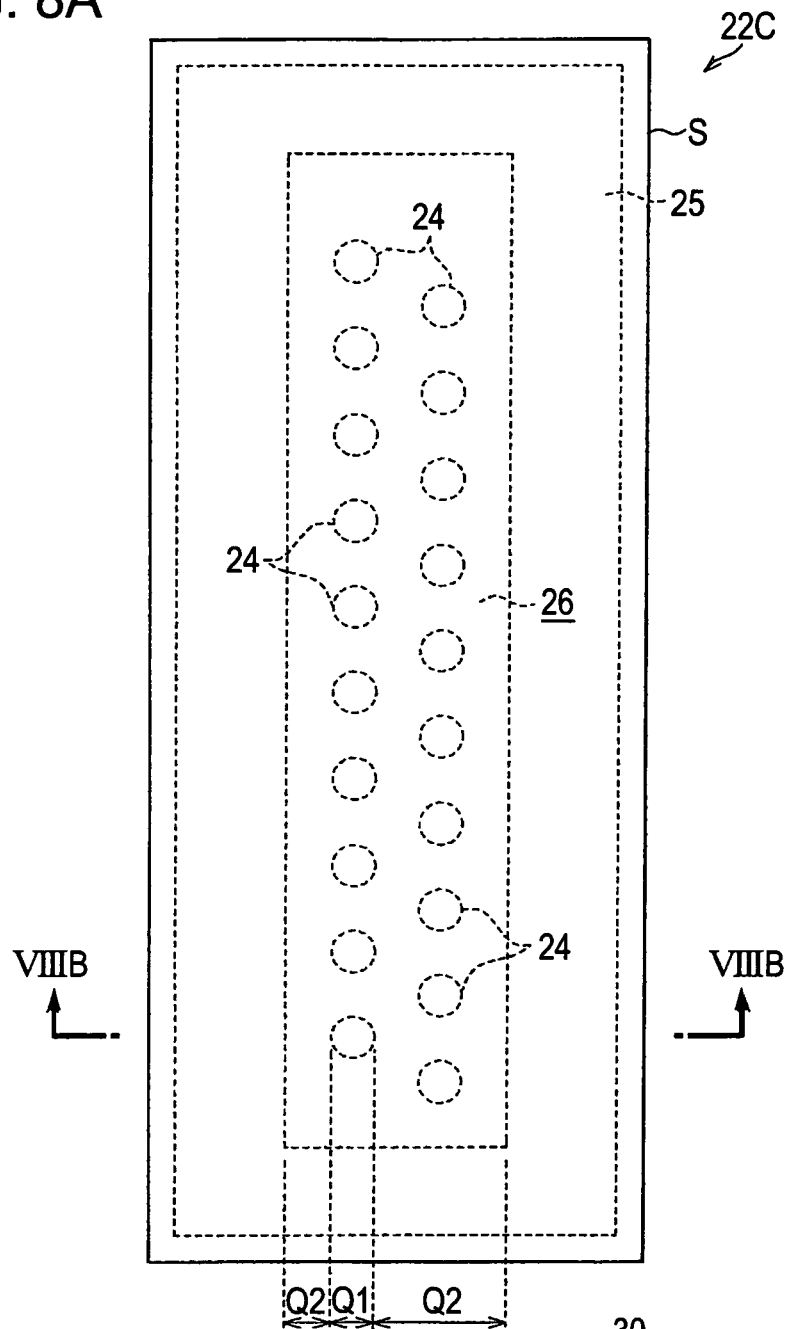
FIG. 8A is a front view of a light emission element array according to a fourth embodiment.
Figure 8B:
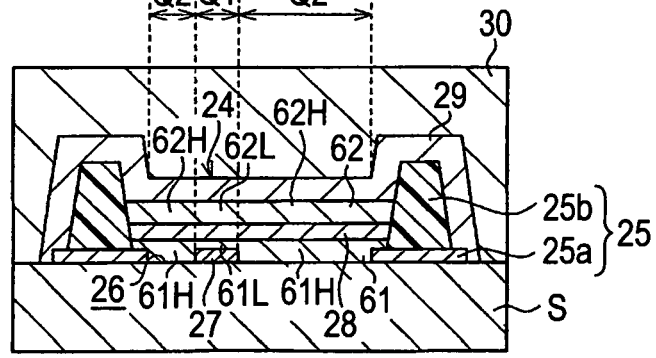
FIG. 8B is a cross-sectional view taken along line VIIIB-VIIIB of FIG. 8A.

FIG. 8A is a front view of a light emission element array 22C according to a fourth embodiment, and FIG. 8B is a cross-sectional view taken along line VIIIB-VIIIB of FIG. 8A.

Each of organic EL elements 24 of the light emission element array 22C include a hole injection layer 61 and an electron injection layer 62, in addition to a light emission layer 28, as a function layer.

In more detail, as shown in FIG. 8B, the hole injection layer 61 is formed on the bottom of a concave region 26 to cover pixel electrodes 27. The hole injection layer 61 is made of a mixture of Poly-3,4-Ethylenedioxythiophene (hereinafter, referred to as "PEDOT") and polystyrene sulfonic acid (hereinafter, referred to as "PSS"). For convenience's sake of explanation, in the hole injection layer 61, the hole injection layer 61 arranged in a region Q1 sandwiched between the pixel electrode 27 and a cathode 29 (formed in the region Q1 on the pixel electrode 27) is denoted by reference numeral 61L and the hole injection layer 61 arranged in a region Q2 between the plurality of pixel electrodes 27 is denoted by reference numeral 61H.

The hole injection layer 61L formed in the region Q1 has a sheet resistance value of about several tens $\Omega/\square$ to several thousands $\Omega/\square$. The hole injection layer 61H formed in the region Q2 has a sheet resistance value of about several M$\Omega/\square$ to several hundreds M$\Omega/\square$, which is higher than that of a typical hole injection material. Accordingly, carriers (holes) supplied from the pixel electrode 27 mostly flow into the hole injection layer 61L, but hardly flow into the hole injection layer 61H.

The light emission layer 28 is formed on the hole injection layer 61. The electron injection layer 62 is formed on the light emission layer 28. In addition, the cathode 29 is formed on the electron injection layer 62 to cover whole of the pixel electrodes 27 and the lyophobic bank 25b.

The electron injection layer 62 is an organic conductive layer and made of a known electron injection material composed of polymer including Polyphenylenevinylene Polymer. For convenience's sake of explanation, in the electron injection layer 62, the electron injection layer 62 arranged in the region Q1 sandwiched between the pixel electrode 27 and the cathode 29 (formed in the region Q1 on the pixel electrode 27) is denoted by reference numeral 62L and the electron injection layer 62 arranged in the region Q2 between the plurality of pixel electrodes 27 is denoted by reference numeral 62H.

The electron injection layer 62L formed in the region Q1 has an electric resistance value of the original electron injection material including polymer including Polyphenylenevinylene Polymer. Meanwhile, the electron injection layer 62H formed in the region Q2 has an electric resistance value higher than that of the original electron injection layer 62 including Polyphenylenevinylene Polymer. Accordingly, carriers (electrons) supplied from the cathode 29 mostly flow into the electron injection layer 62L, but hardly flow into the electron injection layer 62H.

A sealing member 30 is formed on the whole upper surface of the cathode 29. In addition, the hole injection layer 61L, the light emission layer 28, and the electron injection layer 62L compose a function layer. The organic EL element 24, which is a light emission element, is composed by the pixel electrodes 27, the cathode 29, and the function layer sandwiched between the pixel electrodes 27 and the cathode 29.

The organic EL exposure head 2K having the aforementioned structure, as shown in FIG. 8B, the film thicknesses of the hole injection layer 61, the light emission layer 28, and the electron injection layer 62 are uniform over the whole of the concave region 26. Accordingly, the light emission layer 28 having a uniform film thickness is formed on the pixel electrodes 27.

Figure 9A:
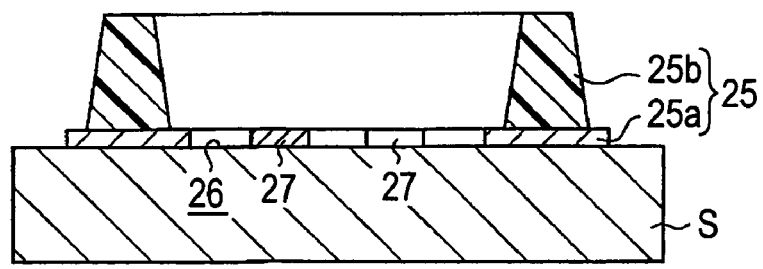
FIGS. 9A to 9C illustrate a method of manufacturing an organic EL printer head related to the fourth embodiment.
Figure 9B:
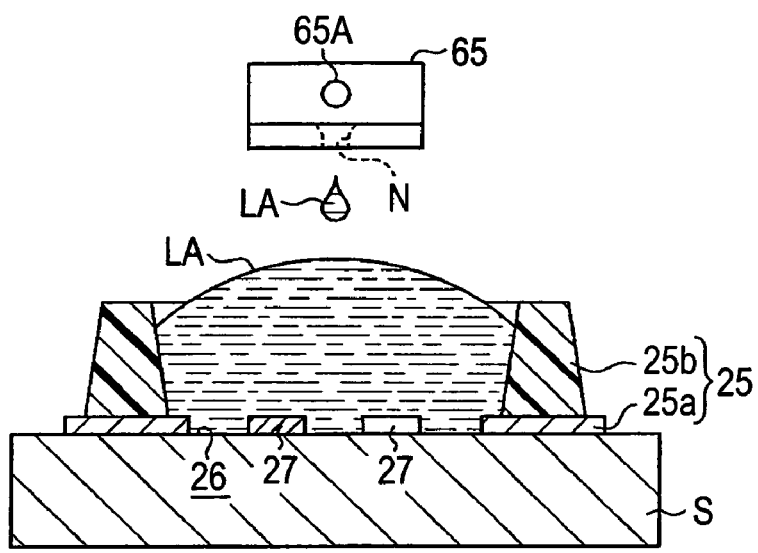

Next, a method of manufacturing the organic EL exposure heads 2K, 2C, 2M, and 2Y will be described with reference to FIGS. 9 to 11. The black organic EL exposure head 2K, the cyan organic EL exposure head 2C, the magenta organic EL exposure head 2M, and the yellow organic EL exposure head 2Y are manufactured by the same method. Accordingly, for convenience' sake of explanation, only the method of manufacturing the black organic EL exposure head 2K will be described and the detailed description of the other organic EL exposure heads 2C, 2M, and 2Y will be omitted.

First, similar to the first embodiment, 20 pixel electrodes 27 are formed on the substantial center of the substrate S in the zigzag shape using a known method. Subsequently, as shown in FIG. 9A, silicon oxide $SiO_2$ is formed and patterned on the substrate S to surround the whole of the plurality of pixel electrodes 27, thereby forming the lyophilic bank 25a. Thereafter, fluoric resin is formed and patterned at a height of 1 to 2 μm on the lyophilic bank 25a to form the lyophobic bank 25b such that a portion of the lyophilic bank 25a is protruded toward the center of the substrate S. Accordingly, the bank 25 is formed on the substrate S to surround the whole of the plurality of pixel electrodes 27 (a bank forming step). As the result, the concave region 26 is formed in the center of the substrate S on which the pixel electrodes 27 are formed.

Subsequently, the hole injection layer 61 is formed in the concave region 26 using a liquid droplet discharge method which is a kind of the liquid process. That is, as shown in FIG. 9B, liquid composition LA formed by dissolving or dispersing the hole injection material mainly including PEDOT/PSS in a specific solvent is discharged from a nozzle N of a discharge head 65. At this time, while the discharge head 65 moves relative to the substrate S forward and backward along a guide rail 65A which is provided in the discharge head 65 and extends along the front side and the rear side of the paper, the liquid composition LA is sequentially discharged into the concave region 26 in plural times. Accordingly, the liquid composition LA is coated on the whole surface of the concave region 26 (a function layer forming step).

In the present embodiment, a mixed ratio of PEDOT/PSS which is the hole injection material is PEDOT:PSS=1:5 to 1:10. As such, if the amount of the PEDOT increases, the electrical resistance of the hole injection material is reduced, the light emission voltage of the light emission element is reduced, and the efficiency and the life span of the light emission element are improved. However, if the resistance of the hole injection material is low, a portion of the hole injection layer functions as an electrode, and thus crosstalk of light emission that, when peripheral portions of the light emission element emit the light or a plurality of light emission elements emit the light, the light emission element light disposed therebetween emits the light may be apt to be generated. To this end, PEDOT:PSS=1:20 is preferably used. In the present embodiment, since a process of making a portion of the hole injection layer 61 have a high resistance is included, a hole injection material having a low electrical resistance can be used.

Next, the substrate S is carried into a sealed container and the solvent is then removed from the liquid composition LA arranged on the substrate S by reducing the pressure in the container, thereby forming a film. When the pressure reduction is performed from atmosphere pressure to 1 Torr for 30 seconds to several minutes, it is possible to form the hole injection layer 61 having higher flatness. In addition, in a case of using plural kinds of solvents, the depressurization may be performed in plural steps such that the pressures are maintained in the vicinities of the vapor pressures of the solvents in correspondence with the respective vapor pressures of the solvents. Accordingly, a speed of drying the liquid composition LA becomes equal over its whole surface and thus the film having higher flatness can be formed. In the invention, since the pixel electrodes 27 are separated from the bank 25 to some extent, the influence of the bank 25 on the state of drying the liquid composition LA arranged thereon is reduced and thus the hole injection layer 61 having a uniform film thickness can be evenly formed on all the pixel electrodes 27.

Figure 9C:
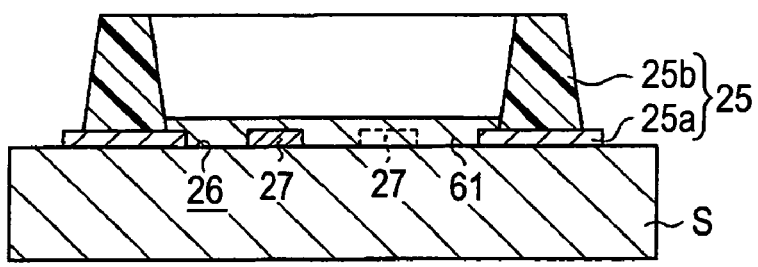

In addition, similar to the first embodiment, the substrate S is heated by mounting the substrate S on, for example, a hot plate, to evaporate the solvent in the liquid composition LA and the hole injection layer 61 is formed on the whole surface of the concave region 26 (see FIG. 9C).

Figure 10A:
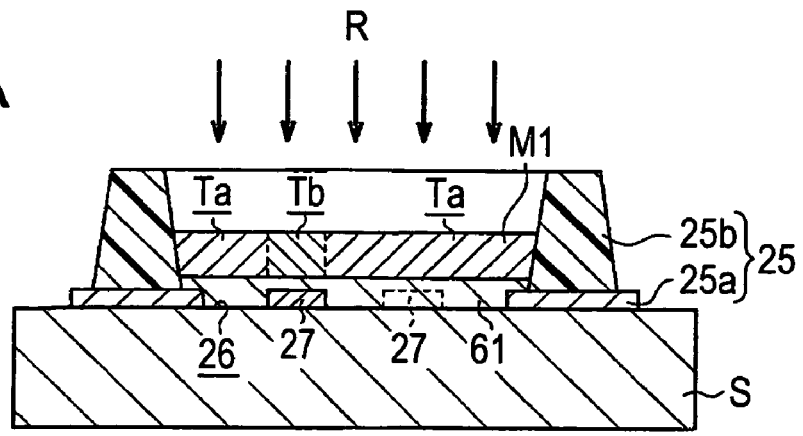
FIGS. 10A to 10C illustrate the method of manufacturing the organic EL printer head related to the fourth embodiment.
Figure 10B:
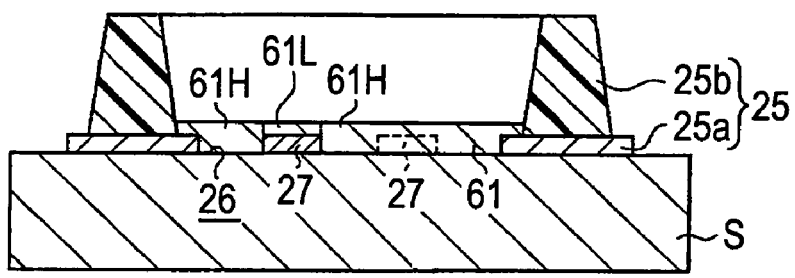

Subsequently, as shown in FIG. 10A, a mask M1 is mounted on the hole injection layer 61. The mask M1 has a size which can cover the whole surface of the hole injection layer 61 and includes transmittance regions Ta which transmit ultraviolet light and non-transmittance regions Tb which do not transmits ultraviolet light. In the mask M1, ten circular non-transmittance regions Tb which are arranged in a row with the same pitch are arranged in two columns. Furthermore, one column of the non-transmittance regions Tb is vertically deviated from the other column of the non-transmittance regions Tb by a half-pitch. That is, the non-transmittance regions Tb of the mask M1 are arranged at a position facing the region Q1 on the pixel electrode 27 and the transmittance regions Ta are arranged at a position facing the region Q2 except the pixel electrode 27. Accordingly, the non-transmittance regions Tb are arranged on the hole injection layer 61 in the region Q1 on the pixel electrode 27 and the transmittance regions Ta are arranged on the hole injection layer 61 formed in the region Q2 except the pixel electrode 27.

As shown in FIG. 6A, ultraviolet light R is irradiated onto the whole surface of the hole injection layer 61 through the mask M1 (light irradiating step). The irradiated ultraviolet light has a wavelength of 350 nm, and preferably 250 to 300 nm. As the result, the ultraviolet light R is irradiated onto only the hole injection layer 61 positioned in the region Q2 and are not irradiated onto the hole injection layer 61 positioned in the region Q1. The structure of the hole injection layer 61 positioned in the region Q2 onto which the ultraviolet light R is irradiated is deformed and thus the electrical resistance value thereof increases. Meanwhile, the structure of the hole injection layer 61 positioned in the region Q1 onto which the ultraviolet light R is not irradiated is not deformed and thus the electrical resistance value thereof is low. Accordingly, the hole injection layer 61 including the hole injection layer 61L having the low electrical resistance value and the hole injection layer 61H having the high electrical resistance value is formed.

Furthermore, a heating treatment is performed at a temperature of 100° C. to 150° C. for 1 minute to several minutes. By performing the heating treatment, the reaction of the region which is exposed to the ultraviolet light is more stably performed and the electrical resistance of the region onto which the ultraviolet light is irradiated can increases with high reproducibility.

In the present embodiment, although a method of using the mask which is closely adhered to or adjacent to the substrate S is described as the method of selectively irradiating the ultraviolet light, the ultraviolet light may be selectively irradiated using a projection exposure apparatus using a mask formed on a glass mask.

Figure 10C:
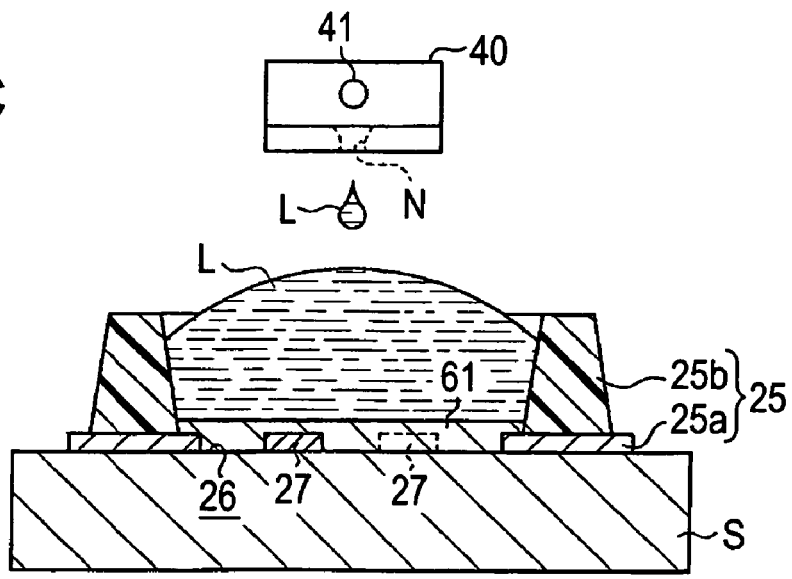

Subsequently, similar to the first embodiment, the light emission layer 28 is formed using a liquid droplet discharge method. That is, as shown in FIG. 10C, liquid composition L formed by dissolving or dispersing a light emission material, which is the composition of the light emission layer 28, in a specific solvent such as xylene is discharged from a nozzle N of a discharge head 40. At this time, while the discharge head 40 moves relative to the substrate S forward and backward along a guide rail 41 which is provided in the discharge head 40, the liquid composition L is sequentially discharged onto the whole surface of the hole injection layer 61. Accordingly, the liquid composition L is coated on the whole surface of the hole injection layer 61.

Next, similar to the step of forming the hole injection layer 61, the substrate S is carried into a sealed container and the solvent is removed from the liquid composition L arranged on the substrate S by reducing the pressure in the container, thereby forming a film. Since the pixel electrodes 27 are separated from the bank 25 to some extent, the light emission layer 28 having a uniform film thickness can be evenly formed on all the pixel electrodes 27.

Next, by mounting the substrate S on, for example, a hot plate, the substrate S may be heated to evaporate the solvent in the liquid composition L, and thus the light emission layer 28 is formed. At this time, since the hole injection layer 61 has a uniform film thickness over the whole surface of the concave region 26, the light emission layer 28 has a uniform film thickness over the whole surface of the concave region 26 after evaporation.

Subsequently, the electron injection layer 62 is formed on the light emission layer 28 using the liquid droplet discharge method. That is, liquid composition formed by dissolving or dispersing an electron injection material including Polyphenylenevinylene Polymer, which is the composition of the electron injection layer 62, in a specific solvent such as xylene is discharged. Thereafter, the substrate S is carried into a sealed container and the solvent in the liquid composition is evaporated by depressurizing the container, thereby forming a film. Alternatively, by mounting the substrate S on, for example, a hot plate, the substrate S may be heated to evaporate the solvent in the liquid composition of the electron injection material. At this time, as shown in FIG. 11A, since the light emission layer 28 has a uniform film thickness over its whole surface, the electron injection layer 62 has a uniform film thickness over the whole surface of the concave region 26.

Figure 11A:
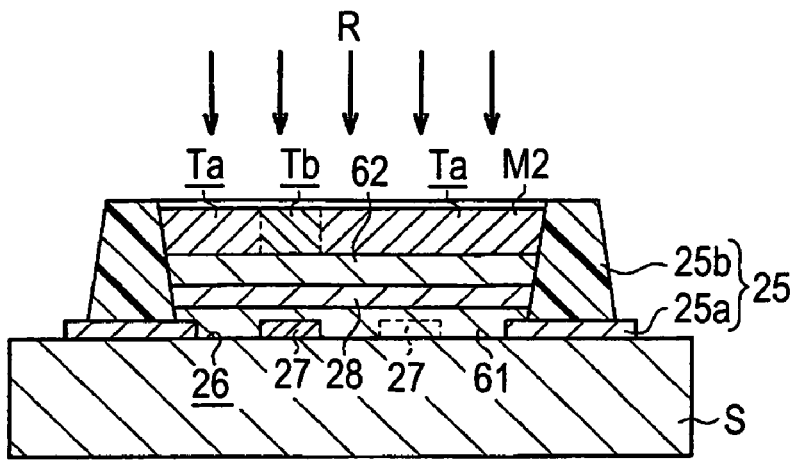
FIGS. 11A to 11C illustrate the method of manufacturing the organic EL printer head related to the fourth embodiment.

Next, as shown in FIG. 11A, a mask M2 is mounted on the electron injection layer 62. The mask M2 has a size which can cover the whole surface of the electron injection layer 62 and has the same shape as that of the mask M1. That is, the mask M2 includes transmittance regions Ta which transmit the ultraviolet light and non-transmittance regions Tb which do not transmit the ultraviolet light, and the non-transmittance regions Tb are arranged at a position facing the region Q1 on the pixel electrode 27 and the transmittance regions Ta are arranged at a position facing the region Q2 except the pixel electrode. Accordingly, the non-transmittance regions Tb are arranged on the electron injection layer 62 in the region Q1 on the pixel electrode 27 and the transmittance regions Ta are arranged on the electron injection layer 62 formed in the region Q2 except the pixel electrode 27.

As shown in FIG. 11A, ultraviolet light R is irradiated onto the whole surface of the electron injection layer 62 through the mask M2 (light irradiating step). The irradiated ultraviolet light has a wavelength of 350 nm, and preferably 250 to 300 nm. As the result, the ultraviolet light R is irradiated onto only the electron injection layer 62 positioned in the region Q2 and are not irradiated onto the electron injection layer 62 positioned in the region Q1. The structure of the electron injection layer 62 positioned in the region Q2 onto which the ultraviolet light R is irradiated is deformed and thus the electrical resistance value thereof increases. On the contrary, the structure of the electron injection layer 62 positioned in the region Q1 onto which the ultraviolet light R is not irradiated is not deformed and thus the electrical resistance value thereof is low. Accordingly, the electron injection layer 62 including the electron injection layer 62L having the low electrical resistance value and the electron injection layer 62H having the high electrical resistance value is formed.

Furthermore, a heating treatment is performed at a temperature of 100° C. to 150° C. for 1 minute to several minutes. By performing the heating treatment, the reaction of the region which is exposed to the ultraviolet light is more stably performed and the electrical resistance of the region onto which the ultraviolet light is irradiated can increases with high reproducibility.

In the present embodiment, although a method of using the mask which is closely adhered to or adjacent to the substrate S is described as the method of selectively irradiating the ultraviolet light, the ultraviolet light may be selectively irradiated using a projection exposure apparatus using a mask formed on a glass mask.

Figure 11B:
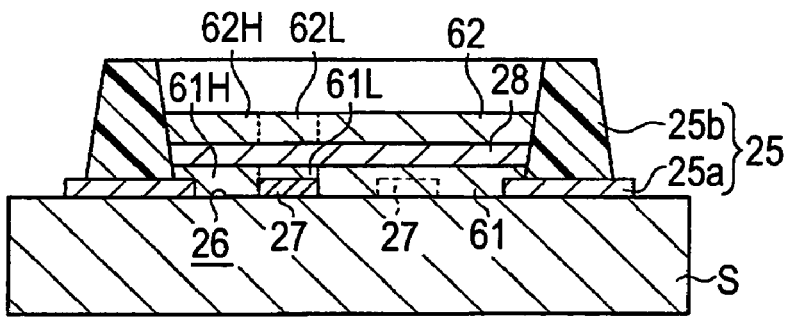
Figure 11C:
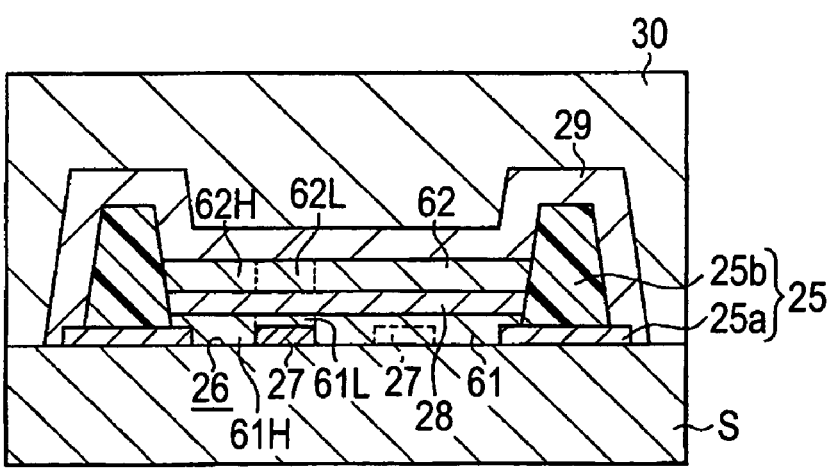

Subsequently, as shown in FIG. 11B, the mask M2 is removed from the electron injection layer 62. Thereafter, a LiF layer, a Ca layer, and an Al layer are laminated on the bank 25 and the electron injection layer 62 by a known deposition method to form the cathode 29. Subsequently, similar to the first embodiment, a sealing member 30 made of a material having a light transmittance, for example, resin, is formed on the whole surface of the cathode 29 (see FIG. 11C).

As described above, according to the present embodiment, the following effects can be obtained.

According to the present embodiment, the hole injection layer 61, the light emission layer 28, and the electron injection layer 62 are formed in the concave region 26 using the liquid droplet discharge method. Accordingly, the hole injection layer 61, the light emission layer 28, and the electron injection layer 62 having desired film thicknesses can be formed without using a vacuum apparatus. In addition, by arranging the plurality of pixel electrodes 27 in the concave region 26, the film thicknesses of the hole injection layer 61, the light emission layer 28, and the electron injection layer 62 formed on the pixel electrodes can be uniform over the pixel electrodes.

According to the present embodiment, the holes supplied from the pixel electrodes 27 and the electrons supplied from the cathode 29 do not flow into the region Q2 except the region Q1 sandwiched between the pixel electrodes 27 and the cathode 29. As the result, when the holes and the electrons are supplied to the light emission layer 28 on a specific pixel electrode 27, it is possible to suppress the crosstalk of the light emission that the peripheral light emission layers or the light emission layers 28 on the adjacent different pixel electrodes 27 simultaneously emit the light. Accordingly, it is possible to realize the organic EL exposure heads 2K, 2C, 2M, and 2Y which can accomplish high-definition imaging. As the result, it is possible to realize the optical printer 1 which can print a high-definition image.

Specially, in an optical writing head for a electrophotographic printer, the spread of the light emission color of each pixel toward the peripheral portion causes the deterioration of contrast when a image is formed on a photosensitive body. Although a method of providing a light shielding layer in the vicinity of the pixel to block the light of the peripheral portions was suggested, since the light emission color is not efficiently used, the use efficiency of the light is deteriorated. In the invention, since the light emission region becomes narrower by concentrating charges to the light emission layer 28 on the pixel electrodes 27, the high use efficiency of the light and high resolution upon forming the image can be simultaneously realized.

According to the present embodiment, by selectively irradiating the ultraviolet light, a region having a high electrical resistance and a region having a low electrical resistance can be formed in the hole injection layer 62 and the electron injection layer 61. Accordingly, the light emission efficiency of the light emission element can be improved and the high definition can be realized, without complicating manufacturing process.

According to the present embodiment, even in a case of using the hole injection material or the electron injection material having a low sheet resistance value, the crosstalk of the light emission can be suppressed. If the hole injection material or the electron injection material having a low sheet resistance value is used, it is possible to reduce the light emission voltage, improve the light emission efficiency, and increase the life span of the light emission element. Accordingly, according to the invention, the low voltage, the improvement of the light emission efficiency, and the increase of the life span of the element can be realized using the hole injection material or the electron injection material having a low sheet resistance value, without deteriorating the resolution of the light emission element or the use efficiency of the light. In addition, in the present embodiment, although the pixel electrodes 27 are used as the anode, the pixel electrodes 27 may be used as a cathode. In this case, by selectively irradiating the ultraviolet light onto the electron injection/ transport layer, the electron injection/transport layer of the pixel electrodes 27 has a high resistance value and thus high effect can be realized.

Fifth Embodiment

Next, a fifth embodiment of the invention will be described with reference to FIG. 12. The structure of the fifth embodiment is identical to that of the fourth embodiment except the structure of a bank. Accordingly, the same elements as that of the fourth embodiment are denoted by the same reference numerals and their detailed description will be omitted.

Figure 12A:
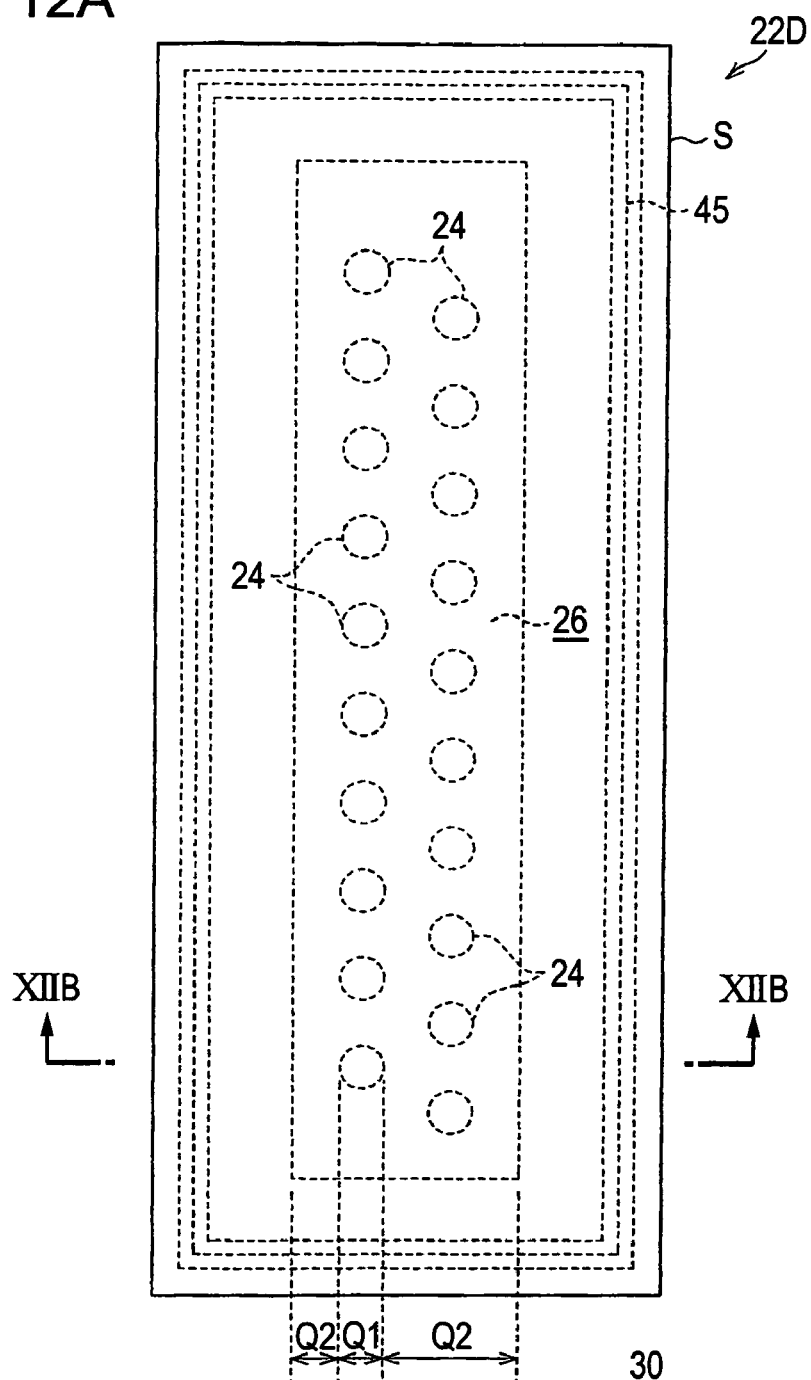
FIG. 12A is a front view of a light emission element array according to a fifth embodiment.
Figure 12B:
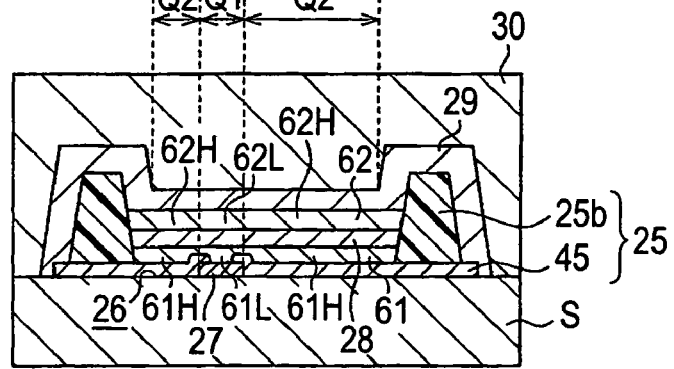
FIG. 12B is a cross-sectional view taken along line XIIB-XIIB of FIG. 12A.

FIG. 12A is a front view of a light emission element array 22D according to the fifth embodiment and FIG. 12B is a cross-sectional view taken along line XIIB-XIIB of FIG. 12A.

As shown in FIG. 12A, similar to the fourth embodiment, the light emission element array 22D includes a plurality of organic EL elements 24 including a hole injection layer 61 and an electron injection layer 62 arranged on a substrate S, in addition to a light emission layer 28. A lyophobic bank 25b is formed to surround the whole of the light emission element array 22D. Furthermore, the hole injection layer 61L and the electron injection layer 62L in a region Q1 on the pixel electrode 27 have electrical resistances lower than those of the hole injection layer 61H and the electron injection layer 62H in a region Q2 except the region Q1 on the pixel electrode 27.

In the present embodiment, a lyophilic bank 45 is disposed to define the pixel electrodes 27. The lyophilic bank 45 has, for example, a film thickness of 50 to 150 nm and is made of silicon oxide ($SiO_2$). Alternatively, the lyophilic bank 45 may be made of a material which does not have lyophilicity and of which the surface is subjected to a lyophilic treatment.

Accordingly, it is possible to avoid concentrating the electric field to the ends of the pixel electrodes 27. As the result, it is possible to increase the life span of the organic EL element 24. In addition, the invention is not limited to the first to fifth embodiments. The following structures may be realized.

Although, in the above-referenced embodiments, the optical writing head for the electrophotographic printer is described, the invention may apply to any structure having a hole injection layer and an electron injection layer. For example, the invention may apply to a display apparatus for performing colorization by combining a color filter to a matrix-shaped white light emission element.

Although, in the above-referenced embodiments, the hole injection layer 61, the electron injection layer 62, and the light emission layer 28 are formed using the liquid droplet discharge method, the invention is not limited to this. For example, the respective liquid compositions including the hole injection material, the electron injection material, and the light emission material may be coated using a dispenser. By this structure, the same effects as those of the above-referenced embodiments can be obtained.

Although, in the above-referenced embodiments, the pixel electrode 27 is circular, the pixel electrode may be rectangular. In this case, by using the rectangular bank 25, the organic EL element 24 including the hole injection layer 61, the electron injection layer 62, and the light emission layer 28 having more uniform film thicknesses can be formed.

Although, in the above-referenced embodiments, the hole injection layer 61 is an organic conductive layer including PEDOT, an organic conductive layer which does not include PEDOT may be used. Furthermore, although the electron injection layer 62 is an organic conductive layer including Polyphenylenevinylene Polymer, an organic conductive layer which includes Polyaniline may be used.

Although, in the above-referenced embodiments, the organic EL element is used as the light emission element, the invention is not limited to this. Any light emission element may be used if at least a portion of layers therein is formed by a liquid composition.

Although, in the fourth and fifth embodiments, the organic EL element 24 includes the pixel electrodes 27, the hole injecting hole 61, the light emission layer 28, the electron injection layer 62, and the cathode 29, the invention is not limited to this. For example, the organic EL element 24 may include a hole transport layer disposed between the hole injection layer 61 and the light emission layer 28 and a electron transport layer disposed between the electron injection layer 62 and the cathode 29, in addition to the pixel electrodes 27, the hole injection layer 61, the light emission layer 28, the electron injection layer 62, and the cathode 29.

In addition, if the hole transport layer and the electron transport layer are provided, by increasing the electrical resistance values of the hole transport layer and the electron transport layer in the region Q2 except the region Q1 on the pixel electrodes 27, the holes supplied from the pixel electrodes 27 can be concentrated to the hole injection layer 61L formed in the region Q1 on the pixel electrodes 27. Accordingly, the crosstalk of the light emission can be suppressed.

In the fourth and fifth embodiments, the hole injection layer 61H and the electron injection layer 62H in the whole of the regions Q2 except the region Q1 on the pixel electrode 27 have high electrical resistance values. Alternatively, only the hole injection layer 61 and the electron injection layer 62 in the region Q2 adjacent to the region Q1 on the pixel electrode 27 may have high resistance values, but not the whole of the region Q2 except the region Q1 on the pixel electrode 27. By this structure, the same effects as those of the above-referenced embodiments can be obtained.

Although, in the fourth and fifth embodiments, the pixel electrodes 27, the hole injection layer 61, the light emission layer 28, the electron injection layer 62, and the cathode 29 are laminated on the substrate S and the hole injection layer 61 and the electron injection layer 62 in the region Q2 except the region Q1 on the pixel electrode 27 have the high resistance values, the layers having the high electrical resistance values are not limited to the hole injection layer 61 and the electron injection layer 62. For example, the pixel electrodes 27, the light emission layer 28, and the cathode 29 may be laminated on the substrate S and the light emission layer 28 in the region Q2 except the region Q1 on the pixel-electrode 27 may have a high electrical resistance value. Accordingly, since the holes supplied from the pixel electrode 27 can be concentrated to the light emission layer 28 formed in the region Q1 on the pixel electrode 27, the crosstalk of the light emission can be suppressed.

Furthermore, the organic EL element 24 may include a hole transport layer disposed between the hole injection layer 61 and the light emission layer 28 and an electron transport layer disposed between the electron injection layer 62 and the cathode 29, in addition to the pixel electrodes 27, the hole injection layer 61, the light emission layer 28, and the electron injection layer 62, and the cathode 29, and the hole transport layer and the electron transport layer in the region Q2 except the region Q1 on the pixel electrode 27 may have high electrical resistance values. The electrical resistance values of the layers in the region Q2 except the region Q1 on the pixel electrode 27 may be higher than the electrical resistance values of the layers in the region Q1 on the pixel electrode 27.

Although, in the above-referenced embodiments, the hole injection layer 61 is the organic conductive layer including PEDOT, the same effects as those of the above-referenced embodiments can be obtained even when an organic conductive layer including Polyaniline is used.

Although, in the fourth and fifth embodiments, the electrical resistance value increases by chemical reaction using the ultraviolet light R, the electrical resistance value may increase using the light other than the ultraviolet light. For example, a region onto which carbon dioxide laser, excimer laser, or YAG laser is irradiated may be thermally deformed to make the resistance value high. In addition, by irradiating laser with higher energy, the film in the irradiated region may be removed by laser ablation. Furthermore, a method of selectively disposing a material having a high absorption ratio of the laser previously irradiated onto a region which is desired to have a high resistance value and irradiating the laser onto the whole surface of a film having an adequate value may be used. It is preferable that such a laser process is performed in atmosphere pressure ambient or inert gas ambient, in order to prevent contamination or deterioration of a function layer. Particularly, it is preferable that the laser process is performed before a step of forming the light emission layer, in order to prevent the deterioration of the light emission layer. For example, in a case where the light emission layer is formed on the hole injection layer, the hole injection layer may be subjected to the laser process.

In the fourth and fifth embodiments, the pixel electrodes 27, the hole injection layer 61, the light emission layer 28, the electron injection layer 62, and the cathode 29 are laminated on the substrate S, and the electrical resistance values of the hole injection layer 61 and the electron injection layer 62 in the region Q2 increase by irradiating the ultraviolet light R onto the hole injection layer 61 and the electron injection layer 62 in the region Q2 except the region Q1 on the pixel electrode 27. Alternatively, a layer made of a specific material which absorbs the ultraviolet light R may be provided on the substrate S right under the hole injection layer 61 except the region in which the pixel electrodes 27 are formed. Similarly, a layer made of a specific material which absorbs the ultraviolet light R may be provided on the light emission layer 28 of the substrate S in the region Q2 except the region Q1 on the pixel electrode 27 right under the electron injection layer 62. In addition, the ultraviolet light R may be irradiated using the masks M1 and M2. Accordingly, since the ultraviolet light R can be efficiently absorbed into the hole injection layer 61 and the electron injection layer 62 in the whole of the region Q2 except the region Q1 on the pixel electrode 27, the electrical resistance values of the hole injection layer 61 and the electron injection layer 62 in the region Q2 can surely increase.

Although, in the fourth and fifth embodiments, the hole injection layer 61 is provided on the pixel electrodes 27 and the electron injection layer 62 is provided right under the cathode 29, the invention is not limited to this. The electron injection layer may be formed on the pixel electrodes 27 and the hole injection layer may be formed right under the cathode 29. That is, even in a case where the pixel electrodes 27 are used as a cathode and the cathode 29 is used as an anode, the electrical resistance value of the electron injection layer in the region Q2 except the region Q1 on the pixel electrode 27 is higher than that of the electron injection layer in the region Q1. In addition, the electrical resistance value of the hole injection layer in the region Q2 except the region Q1 on the pixel electrode 27 is higher than that of the hole injection layer in the region Q1. Even in this structure, the same effects as those of the above-referenced embodiments can be obtained.

What is claimed is:

1. An electrooptical apparatus comprising:
   a plurality of pixel electrodes vertically arranged in at least two rows and horizontally arranged in at least two columns;
   a barrier rib which surrounds the at least two rows and the at least two columns, and a function layer formed on the plurality of pixel electrodes in a whole region surrounded by the barrier rib, the barrier rib being formed such that distances measured along horizontal lines drawn from a center of each of the pixel electrodes to a closest barrier rib are equal, and the horizontal lines being parallel to each other.

2. The electrooptical apparatus according to claim 1, the function layer being formed by a liquid process.

3. The electrooptical apparatus according to claim 2, further comprising:
   a plurality of light emission elements being formed by forming the function layer including at least a light emission layer between the plurality of pixel electrodes and a common electrode facing the plurality of pixel electrodes, and the light emission layer being composed of an organic material.

4. The electrooptical apparatus according to claim 1, the plurality of pixel electrodes being arranged in a zigzag shape.

5. The electrooptical apparatus according to claim 3, an electrical resistance value of the function layer disposed between the plurality of pixel electrodes being higher than that of the function layer disposed in a region sandwiched between the pixel electrodes and the common electrode.

6. The electrooptical apparatus according to claim 5, the function layer including an organic conductive layer, and an electrical resistance value of the organic conductive layer disposed between the plurality of pixel electrodes being higher than that of the organic conductive layer disposed in a region sandwiched between the plurality of pixel electrodes and the common electrode.

7. The electrooptical apparatus according to claim 6, the organic conductive layer including Poly-3,4-Ethylenedioxythiophene.

8. The electrooptical apparatus according to claim 6, the organic conductive layer including Polyaniline.

9. The electrooptical apparatus according to claim 1, the light emission element array selectively irradiating light onto a photosensitive body.

10. A method of manufacturing an electrooptical apparatus comprising:
    forming a plurality of pixel electrodes vertically arranged in at least two rows and horizontally arranged in at least two columns;
    forming a barrier rib which surrounds the at least two rows and the at least two columns; and forming a function layer in a whole region surrounded by the barrier rib, the barrier rib being formed such that distances measured along horizontal lines drawn from a center of each of the pixel electrodes to a closest barrier rib are equal, and the horizontal lines being parallel to each other.

11. The method according to claim 10, the function layer being formed using a liquid droplet discharge method.

12. The method according to claim 10, further comprising selectively irradiating light onto the function layer.

13. The method according to claim 10, light being selectively irradiated onto the function layer in a region disposed between the pixel electrodes.

14. The method according to claim 13, the light being ultraviolet light.

15. The method according to claim 13, the function layer being heated after irradiating the light.

16. The electrooptical apparatus according to claim 1, no portion of the barrier rib being interposed between vertically adjacent nor horizontally adjacent pixel electrodes.

17. The method according to claim 10, no portion of the barrier rib being interposed between vertically adjacent nor horizontally adjacent pixel electrodes.

18. The electrooptical apparatus according to claim 1, each of the plurality of pixel electrodes being connected to a driving circuit independently.

* * * * *